(12) United States Patent
Jin et al.

(10) Patent No.: US 11,781,235 B2
(45) Date of Patent: Oct. 10, 2023

(54) PLATING APPARATUS AND PLATING METHOD

(71) Applicant: ACM Research (Shanghai) Inc., Shanghai (CN)

(72) Inventors: Yinuo Jin, Shanghai (CN); Hongchao Yang, Shanghai (CN); Jian Wang, Shanghai (CN); Hui Wang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 0 days.

(21) Appl. No.: 17/419,036

(22) PCT Filed: Dec. 28, 2018

(86) PCT No.: PCT/CN2018/124649
§ 371 (c)(1),
(2) Date: Jun. 28, 2021

(87) PCT Pub. No.: WO2020/133149
PCT Pub. Date: Jul. 2, 2020

(65) Prior Publication Data
US 2022/0081796 A1    Mar. 17, 2022

(51) Int. Cl.
*C25D 5/18* (2006.01)
*C25D 7/12* (2006.01)
(Continued)

(52) U.S. Cl.
CPC .............. *C25D 5/18* (2013.01); *C25D 7/123* (2013.01); *C25D 17/001* (2013.01); *C25D 17/002* (2013.01); *C25D 21/12* (2013.01)

(58) Field of Classification Search
CPC ... C25D 5/18; C25D 5/10; C25D 5/12; C25D 5/14; C25D 5/16; C25D 17/001; C25D 21/12
See application file for complete search history.

(56) References Cited

U.S. PATENT DOCUMENTS

| | | |
|---|---|---|
| 6,344,124 B1 | 2/2002 | Bhatnagar |
| 6,919,010 B1 * | 7/2005 | Mayer .................. C25D 17/12 205/291 |

(Continued)

FOREIGN PATENT DOCUMENTS

| | | |
|---|---|---|
| CN | 1290310 A | 4/2001 |
| CN | 101302644 A | 11/2008 |

(Continued)

OTHER PUBLICATIONS

Office Action issued in Japanese Application No. 2021-537986, dated May 17, 2022 (6 pages).

(Continued)

*Primary Examiner* — Brian W Cohen
(74) *Attorney, Agent, or Firm* — Osha Bergman Watanabe & Burton LLP

(57) ABSTRACT

A plating apparatus and plating methods for plating metal layers on a substrate. In an embodiment, a plating method comprises: step 1: immersing a substrate into plating solution of a plating chamber assembly including at least a first anode and a second anode (3001); step 2: turning on a first plating power supply applied on the first anode, setting the first plating power supply to output a power value $P_{11}$ and continue with a period $T_{11}$ (3002); step 3: when the period $T_{11}$ ends, adjusting the first plating power supply applied on the first anode to output a power value $P_{12}$ and continue with a period $T_{12}$, at the same time, turning on a second plating power supply applied on the second anode, and setting the second plating power supply to output a power value $P_{21}$ and continue with a period $T_{21}$ (3003); and step 4: when the period $T_{21}$ ends, adjusting the second plating power supply applied on the second anode to output a power value $P_{22}$ and continue with a period $T_{22}$; wherein step 2 to step 4 are performed periodically.

10 Claims, 35 Drawing Sheets

(51) Int. Cl.
*C25D 17/00* (2006.01)
*C25D 21/12* (2006.01)

(56) References Cited

U.S. PATENT DOCUMENTS

| | | |
|---|---|---|
| 2001/0040100 A1 | 11/2001 | Wang |
| 2006/0219565 A1* | 10/2006 | Preusse ................ C25D 17/10 257/E21.585 |
| 2008/0179192 A1 | 7/2008 | Arvin et al. |
| 2009/0159451 A1* | 6/2009 | Tomantschger ......... C25D 1/00 205/148 |
| 2012/0292181 A1 | 11/2012 | McHugh et al. |
| 2014/0238864 A1* | 8/2014 | Lin ....................... C25D 5/617 204/229.5 |
| 2014/0367264 A1 | 12/2014 | Wilson et al. |
| 2015/0156888 A1 | 6/2015 | Kawai |

FOREIGN PATENT DOCUMENTS

| | | |
|---|---|---|
| CN | 104221203 A | 12/2014 |
| CN | 104233423 A | 12/2014 |
| CN | 105297096 A | 2/2016 |
| JP | 2002-503766 A | 2/2002 |
| JP | 2015-106653 A | 6/2015 |
| JP | 2018-505960 A | 3/2018 |
| WO | 2016/087507 A1 | 6/2016 |

OTHER PUBLICATIONS

Office Action issued in Chinese Application No. 201880100523.X, dated Apr. 20, 2022 (19 pages).
International Search Report issued in International Application No. PCT/CN2018/124649 dated Jul. 31, 2019 (4 pages).
Written Opinion issued in International Application No. PCT/CN2018/124649 dated Jul. 31, 2019 (4 pages).
Office Action issued in Chinese Application No. 201880100523.X, dated Jan. 13, 2023 (9 pages).

* cited by examiner

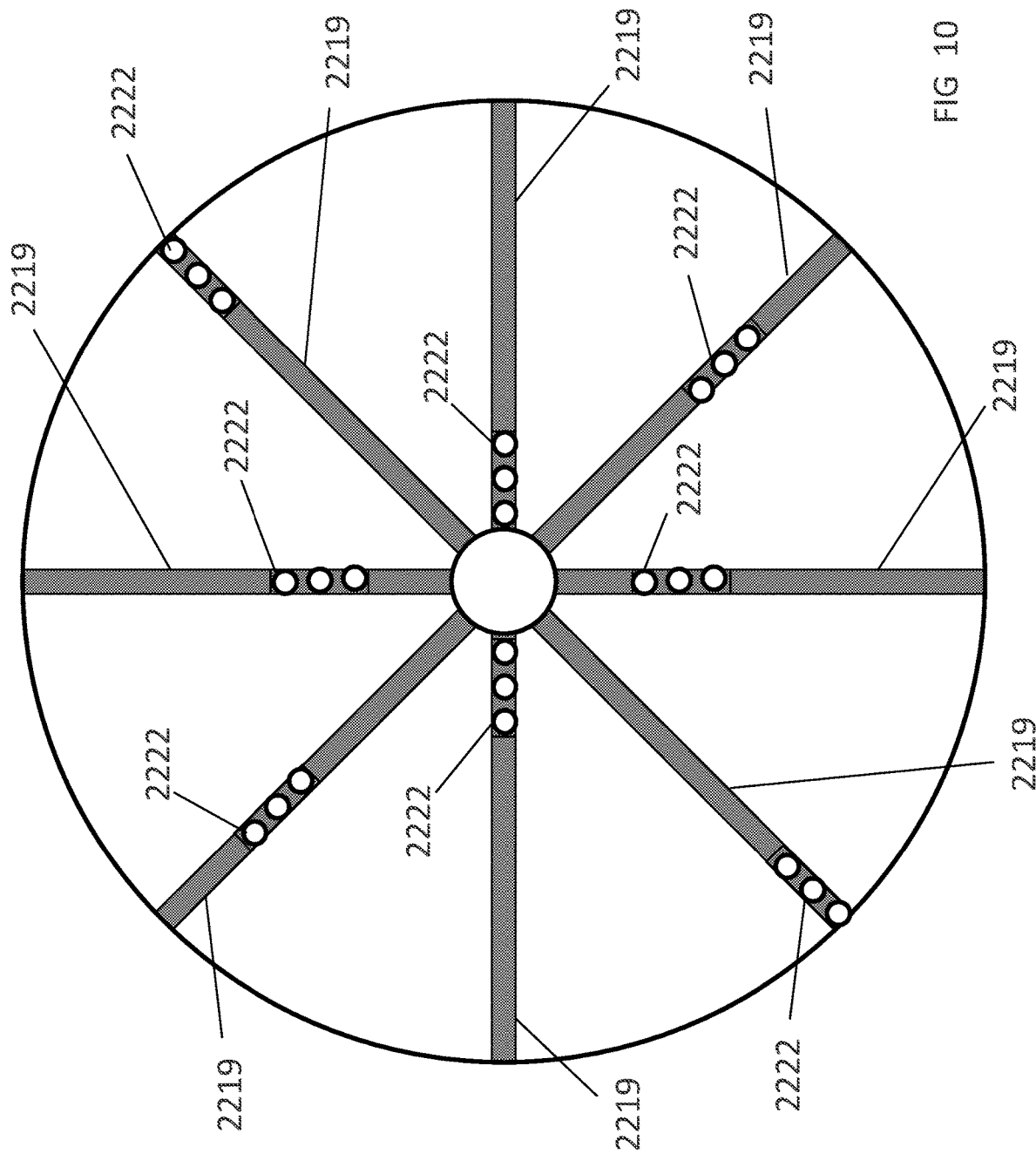

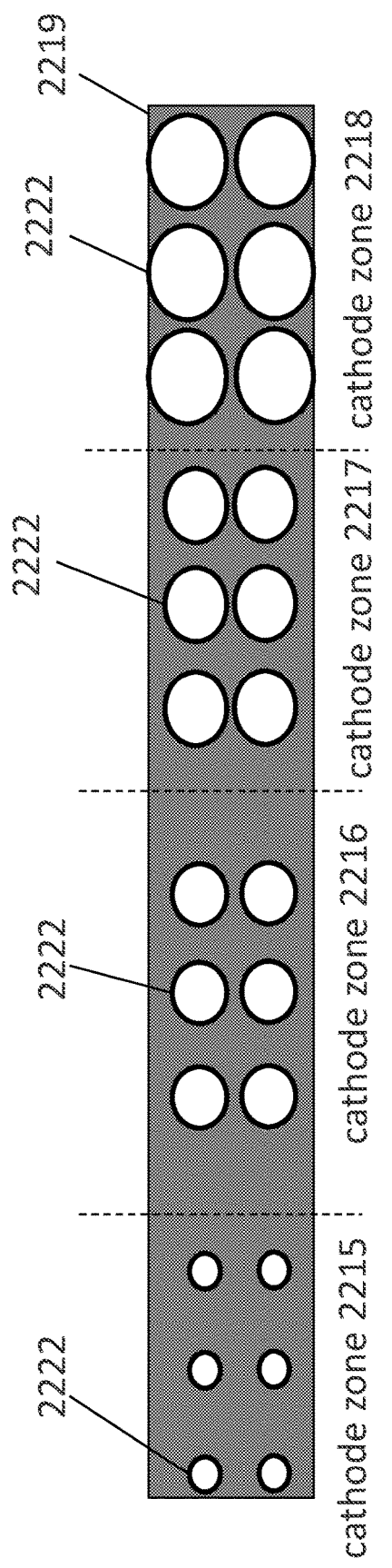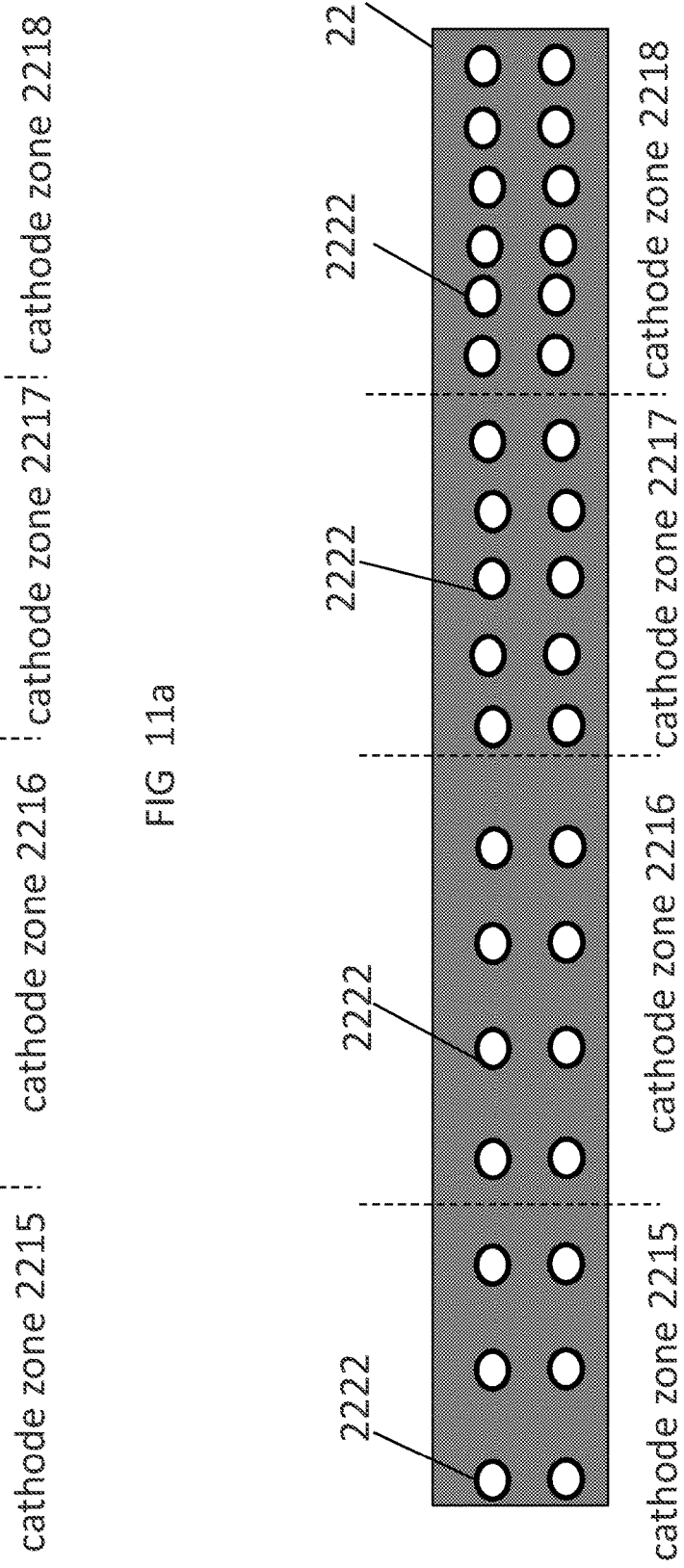
FIG 11a
FIG 11b

| Mode | Partial Plating Mode Definition ||||||| |
|---|---|---|---|---|---|---|---|
| | Output Status $T_{n1}$ ||| Output Status $T_{n2}$ ||| Application |
| | Power Type | Value | Pulse Length | Power Type | Value | Pulse Length | |
| $M_{0A1}$ | Current | Low (<1ASD) | Short (<10ms) | | | | $T_{n1}$ Protect seed layer |
| $M_{0A2}$ | Voltage | Low (<1ASD) | Short (<10ms) | | | | $T_{n1}$ Protect seed layer |
| $M_{0B1}$ | Current | Low (<1ASD) | Long (>10ms) | | | | $T_{n1}$ Repair seed layer |
| $M_{0B2}$ | Voltage | Low (<1ASD) | Long (>10ms) | | | | $T_{n1}$ Repair seed layer |
| $M_1$ | Current | High (>1ASD) | Long (>10ms) | Current | | | $T_{n1}$ Plating |
| $M_2$ | Current | High (>1ASD) | Long (>10ms) | Current | Low current (<1ASD) | Long (>10ms) | $T_{n1}$ Plating+ $T_{n2}$ Repair seed layer |
| $M_3$ | Current | High (>1ASD) | Long (>10ms) | Voltage | Low voltage No current (0ASD) | Long (>10ms) | $T_{n1}$ Plating+ $T_{n2}$ Protect seed layer |
| $M_4$ | Current | High (>1ASD) | Long (>10ms) | Voltage | Low voltage Low current (<1ASD) | Long (>10ms) | $T_{n1}$ Plating+ $T_{n2}$ Repair seed layer |
| $M_5$ | Voltage | High (>1ASD) | Long (>10ms) | Voltage | Low voltage No current (0ASD) | Long (>10ms) | $T_{n1}$ Plating+ $T_{n2}$ Protect seed layer |
| $M_6$ | Voltage | High (>1ASD) | Long (>10ms) | Voltage | Low voltage Low current (<1ASD) | Long (>10ms) | $T_{n1}$ Plating+ $T_{n2}$ Repair seed layer |

Remark: Current/voltage will be converted to current density to be described

FIG. 29

PLATING APPARATUS AND PLATING METHOD

FIELD OF THE INVENTION

The present invention generally relates to a plating apparatus and a plating method for depositing metal layers on a surface of a substrate, and more particularly to a plating apparatus and a plating method for depositing metal layers on a substrate to form interconnection structures in semiconductor devices.

BACKGROUND

With the development of integrated circuit technology and process, a new interconnection technology is required to break through the limitations of a traditional interconnection technology. Aluminum interconnection with aluminum and aluminum alloy as conductor material and silicon dioxide as dielectric material is called the first generation interconnection technology. In the era of very large scale integrated circuit (VLSI), the aluminum interconnection technology can basically meet the requirements of circuit performance, and thus has been widely used. However, as the device feature size goes into the deep submicron field, it requires the width of metal interconnections decreases and the number of metal interconnection layers increases. But due to the use of aluminum as the interconnection material, with the increase of the number of metal interconnection layers and the decrease of the width of metal interconnections, aluminum interconnection resistance increases, which causes the increase of the delay time of circuit, signal attenuation and crosstalk effect, electro-migration aggravation and stress migration failure, seriously affecting the reliability of circuit.

Therefore, a new process uses copper (Cu) and low K dielectric materials to replace traditional aluminum and silicon dioxide to form interconnection structures in semiconductor devices. The Cu interconnection process based on Damascus structure is called the second generation interconnection process. An exemplary Damascus process which can be used to form Cu interconnections in semiconductor devices may include the following steps: forming a dielectric layer on a substrate; forming recessed areas such as vias or trenches and the like in the dielectric layer; depositing a barrier layer on the dielectric layer and the walls of the recessed areas; depositing a seed layer on the barrier layer and the walls of the recessed areas; depositing Cu layer on the seed layer and filling the recessed areas with Cu; removing the Cu layer, the seed layer and the barrier layer which are formed on non-recessed areas. The Cu layer remained in the recessed areas forms interconnection structures. Various techniques have been developed to deposit Cu layer in the recessed areas to form interconnection structures, such as PVD (physical vapor deposition), CVD (chemical vapor deposition), electroplating. Comparing to PVD and CVD, electroplating has excellent gap filling capability and higher deposition rate. Therefore, electroplating is gradually popularized to deposit Cu layer in the recessed areas. However, with the device manufacturing node continuing to shrink, narrower lines are applied in the next generation semiconductor devices. To implement the narrower lines process, a thinner Cu seed layer or new seed layer materials such as cobalt (Co) are applied. The thinner Cu seed layer and new seed layer materials cause high resistivity, making the electroplating Cu layer to fill the recessed areas become difficult. Besides, the current for traditional electroplating is direct current mode. If increasing the plating current for raising the plating rate, it will result in voids while filling small gaps.

SUMMARY

According to an embodiment, a plating method for plating metal layers on a substrate comprises:

step 1: immersing a substrate into plating solution of a plating chamber assembly including at least a first anode and a second anode;

step 2: turning on a first plating power supply applied on the first anode, setting the first plating power supply to output a power value $P_{11}$ and continue with a period $T_{11}$;

step 3: when the period $T_{11}$ ends, adjusting the first plating power supply applied on the first anode to output a power value $P_{12}$ and continue with a period $T_{12}$, at the same time, turning on a second plating power supply applied on the second anode, and setting the second plating power supply to output a power value $P_{21}$ and continue with a period $T_{21}$; and step 4: when the period $T_{21}$ ends, adjusting the second plating power supply applied on the second anode to output a power value $P_{22}$ and continue with a period $T_{22}$;

wherein step 2 to step 4 are performed periodically.

According to another embodiment, a plating method for plating metal layers on a substrate comprises:

step 1: making a substrate enter into plating solution of a plating chamber assembly including at least a first anode and a second anode and at the same time, turning on a first plating power supply applied on the first anode, setting the first plating power supply to output a power value $P_{11}$ and continue with a period $T_{11}$;

step 2: when the period $T_{11}$ ends, adjusting the first plating power supply applied on the first anode to output a power value $P_{12}$ and continue with a period $T_{12}$, at the same time, turning on a second plating power supply applied on the second anode, and setting the second plating power supply to output a power value $P_{21}$ and continue with a period $T_{21}$;

step 3: when the period $T_{21}$ ends, adjusting the second plating power supply applied on the second anode to output a power value $P_{22}$ and continue with a period $T_{22}$;

wherein the first plating power supply and the second plating power supply are adjusted periodically.

According to an embodiment, a plating apparatus for plating metal layers on a substrate comprises:

a plating chamber assembly, further comprising:

an anode chamber, being divided into multiple independent anode zones, every independent anode zone accommodating an anode powered by a plating power supply and having an independent anolyte inlet, an independent anolyte outlet and an independent vent drain outlet;

a membrane frame, being fixed on the top of the anode chamber, the membrane frame having a base portion, the top of the base portion extending upward to form a side wall, the base portion and the side wall forming a cathode chamber, a plurality of first separating walls being disposed on the top of the base portion to divide the cathode chamber into multiple cathode zones, the base portion having a plurality of pairs of branch pipes for supplying plating solution to the cathode zones, each branch pipe having a plurality of supply holes;

a membrane, being attached on the bottom of the base portion of the membrane frame to separate the anode chamber and the cathode chamber; wherein the anode chamber is divided into at least two independent anode zones, a first anode is accommodated in one independent anode zone and is powered by a first plating power supply, a second anode is accommodated in the other independent anode zone and is powered by a second plating power supply, the plating apparatus further comprises:

a controller configured to control the first plating power supply and the second plating power supply to operate as follows:

the first plating power supply is set to output a power value $P_{11}$ and continue with a period $T_{11}$, when the period $T_{11}$ ends, the first plating power supply is adjusted to output a power value $P_{12}$ and continue with a period $T_{12}$, at the same time, the second plating power supply is set to output a power value $P_{21}$ and continue with a period $T_{21}$, and when the period $T_{21}$ ends, the second plating power supply is adjusted to output a power value $P_{22}$ and continue with a period $T_{22}$; the first plating power supply and the second plating power supply are controlled by the controller as above periodically.

BRIEF DESCRIPTION OF THE DRAWINGS

FIG. 10 is a schematic view showing independent plating solution supply of cathode zones;

FIG. 11a is a schematic view showing plating solution supply holes corresponding to the cathode zones have same density but different diameter, and FIG. 11b is a schematic view showing plating solution supply holes corresponding to the cathode zones have same diameter but different density;

FIG. 29 is a table showing partial plating modes definition according to the present invention;

DETAILED DESCRIPTION

Figure 1:
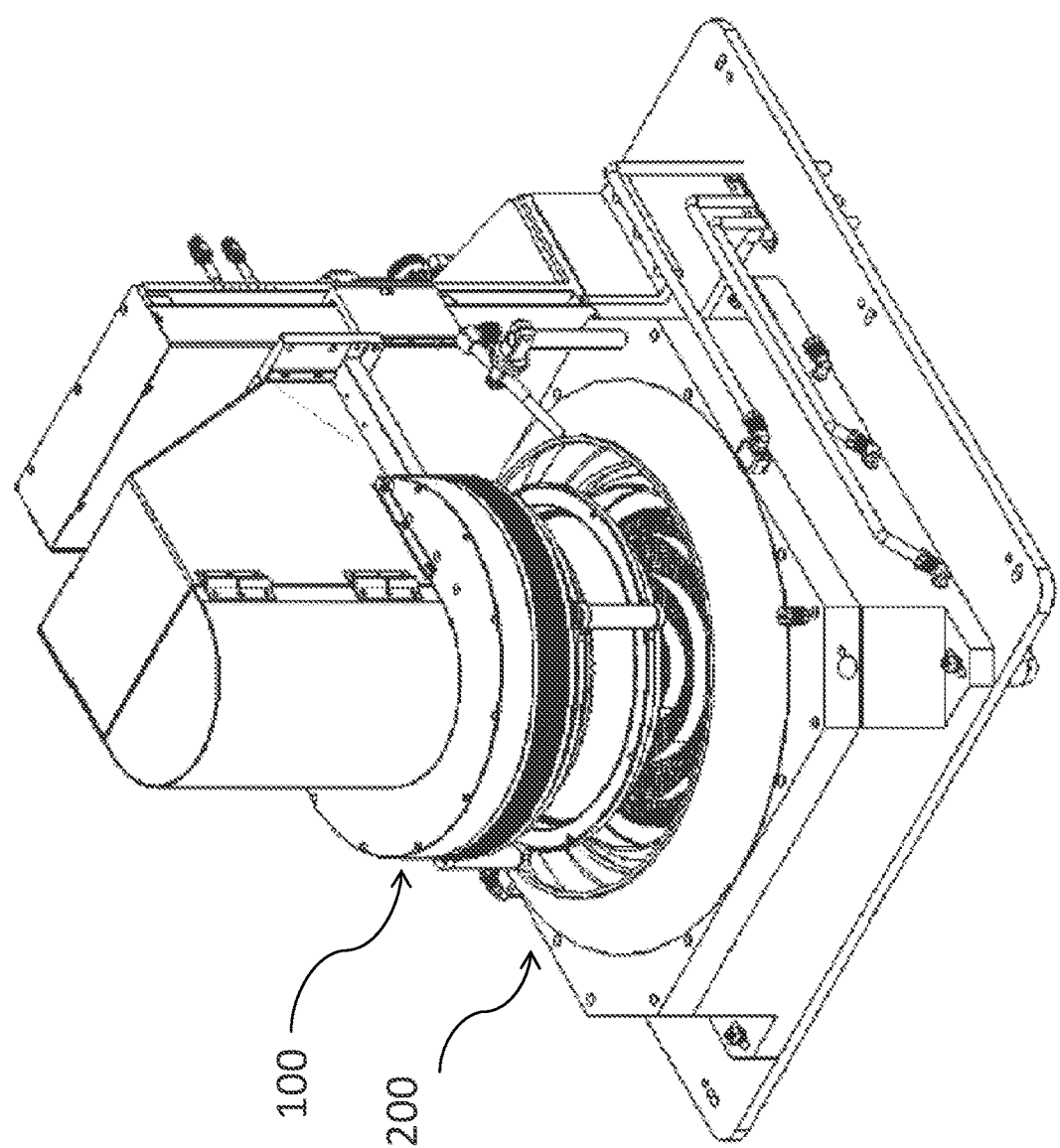
FIG. 1 is a perspective view of a plating apparatus according to an exemplary embodiment of the present invention.
Figure 2:
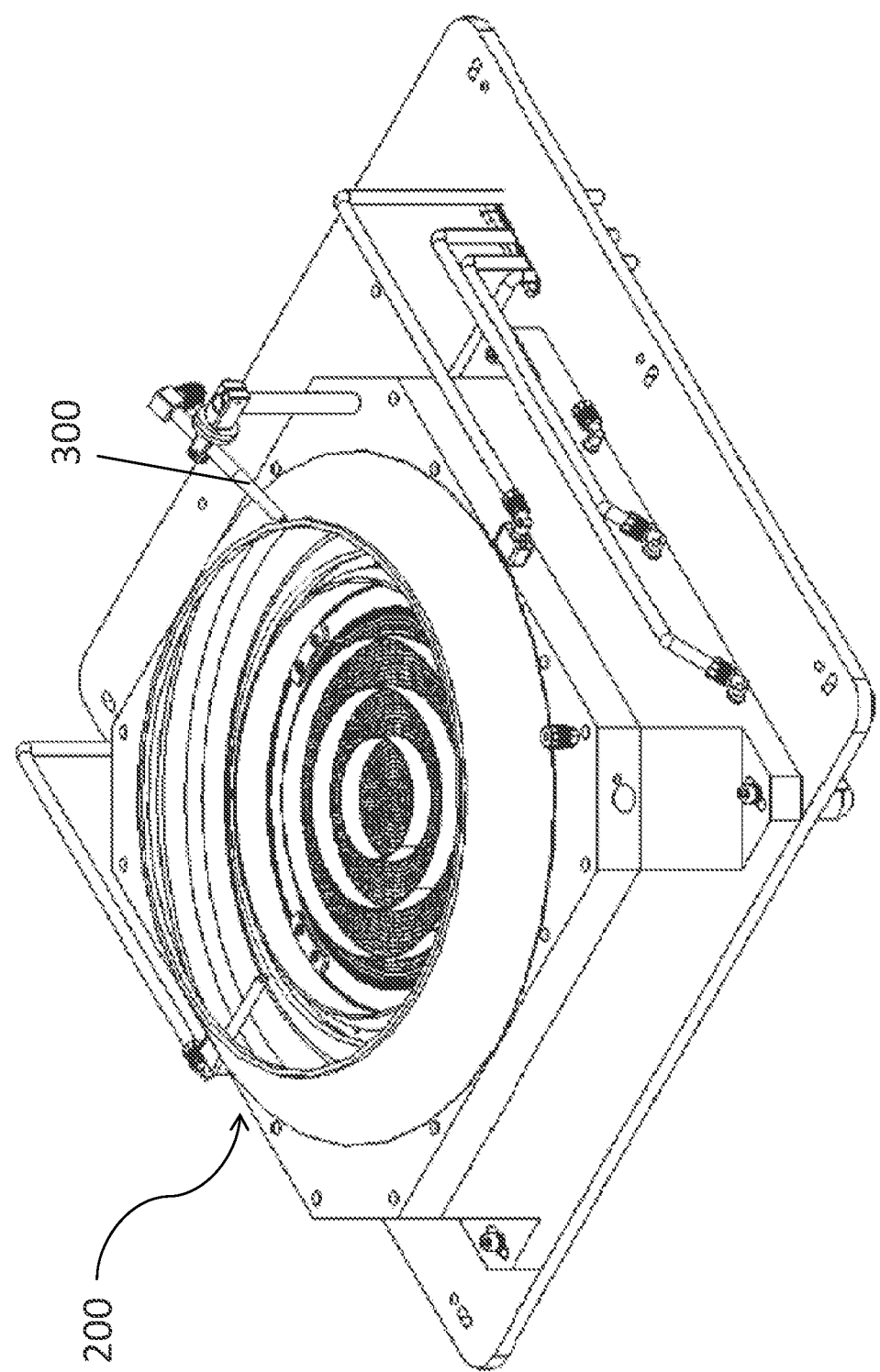
FIG. 2 is a perspective view of a plating chamber assembly according to an exemplary embodiment of the present invention.

FIG. 1 shows a plating apparatus according to an exemplary embodiment of the present invention. The plating apparatus includes a chuck assembly 100 and a plating chamber assembly 200. The chuck assembly 100 is configured to hold a substrate for plating. The chuck assembly 100 is capable of holding the substrate to rotate at a desired speed, tilt a desired angle relative to a horizontal plane, and move up and down. More detailed description of the chuck assembly 100 has been disclosed in PCT application no. PCT/CN2015/096402, filed on Dec. 4, 2015, all of which is incorporated herein by reference.

Referring to FIG. 2 to FIG. 7, the plating chamber assembly 200 includes an anode chamber 210, a cathode chamber 220 setting on the top of the anode chamber 210, a membrane 230 separating the anode chamber 210 and the cathode chamber 220, a peripheral chamber 240 encircling the anode chamber 210 and the cathode chamber 220, and a shroud 250 setting on the top of the peripheral chamber 240.

The anode chamber 210 is divided into multiple anode zones 211 and every two adjacent anode zones 211 are separated by a vertically arranged partition 212. The material of the partitions 212 is non-conductive and chemical resistant. The partitions 212 separate the electric fields and restrict the electrolyte flow fields. In an embodiment, no limitation to the present invention, the anode chamber 210 is divided into four anode zones 211. Every anode zone 211 accommodates an anode 2111. The anodes 2111 can be, for example, copper cylinders or copper particles. The four anodes 2111 can be respectively numbered a first anode, a second anode, a third anode and a fourth anode from the center to edge of the anode chamber 210. It should be recognized that according to different process requirements, the anodes 2111 can be made of different materials.

Figure 4:
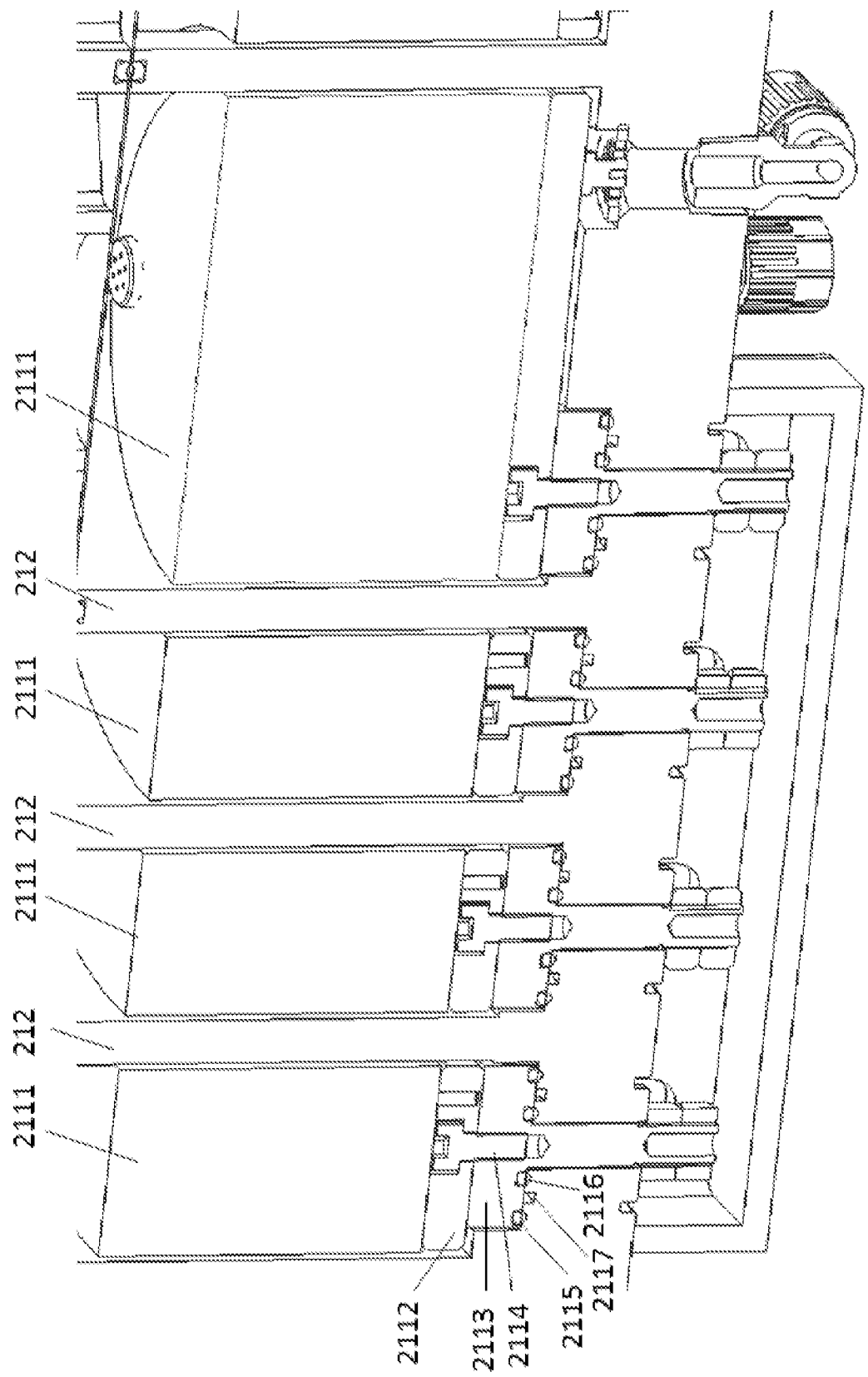
FIG. 4 is a partial enlarged view showing anodes electric connection.

As shown in FIG. 4, every anode zone 211 further accommodates a conductive plate 2112 and a T-shaped conductive connecting member 2113, both of which can be made of Ti. The connecting member 2113 has a horizontal portion and a vertical portion. The conductive plate 2112 is located underneath the anode 2111. The horizontal portion of the connecting member 2113 is set underneath the conductive plate 2112 and the vertical portion of the connecting member 2113 passes through a through-hole defined at the bottom of the anode zone 211 for connecting to an independently controlled plating power supply. The plating power supply can be a direct current/voltage or a pulse power supply. Plating current or voltage is supplied to each of the anodes 2111 through the corresponding connecting member 2113 and the conductive plate 2112 for implementing partial plating. Alternatively, in an embodiment, all the connecting members 2113 are connected to a plating power supply and the plating power supply is capable of switching over among the anodes 2111 for implementing partial plating. A screw 2114 is used to fix the conductive plate 2112 and the connecting member 2113 together. For preventing the plating solution in the anode zone 211 from leaking to the through-hole, an outer seal ring 2115 and an inner seal ring 2116 are respectively set between the horizontal portion of the connecting member 2113 and the bottom of the anode zone 211. The bottom of the anode zone 211 further defines a deionized water trough 2117 between the outer seal ring 2115 and the inner seal ring 2116. The outer seal ring 2115, the inner seal ring 2116 and the deionized water trough 2117 are concentric rings. The deionized water trough 2117 contains deionized water. The seal effect is improved by using the double seal rings. If the seal effect of the outer seal ring 2115 is destroyed by crystals of the plating solution, the inner seal ring 2116 can prevent the plating solution from leaking to the through-hole. The plating solution having flowed through the outer seal ring 2115 flows into the deionized water trough 2117. The plating solution is diluted in the deionized water trough 2117, avoiding the plating solution crystallizing around the inner seal ring 2116 to destroy the seal effect of the inner seal ring 2116.

A membrane frame 221 is fixed on the top of the anode chamber 210 and the bottom of the membrane frame 221 is supported by the partitions 212. The membrane frame 221 is configured to form the cathode chamber 220. The membrane 230 is attached on the bottom of the membrane frame 221 to separate the anode chamber 210 and the cathode chamber 220. A plurality of pairs of seal rings 260 are configured to completely separate the anode zones 211 so as to guarantee no any mass and energy transmission between the anode zones 211. Specifically, one pair of seal rings 260 is set between the bottom of the membrane frame 221 and the top of the anode chamber 210 and the other pairs of seal rings 260 are respectively set between the bottom of the membrane frame 221 and the top of the partitions 212 to form completely independent anode zones 211. Every independent anode zone 211 has an anolyte inlet 213 which is connected to an electrolyte flow control device for supplying plating solution to the anode zone 211. Every independent anode zone 211 has an anolyte outlet 214 for discharging aged electrolyte, decomposition products, and particles from the anode zone 211.

Figure 6:
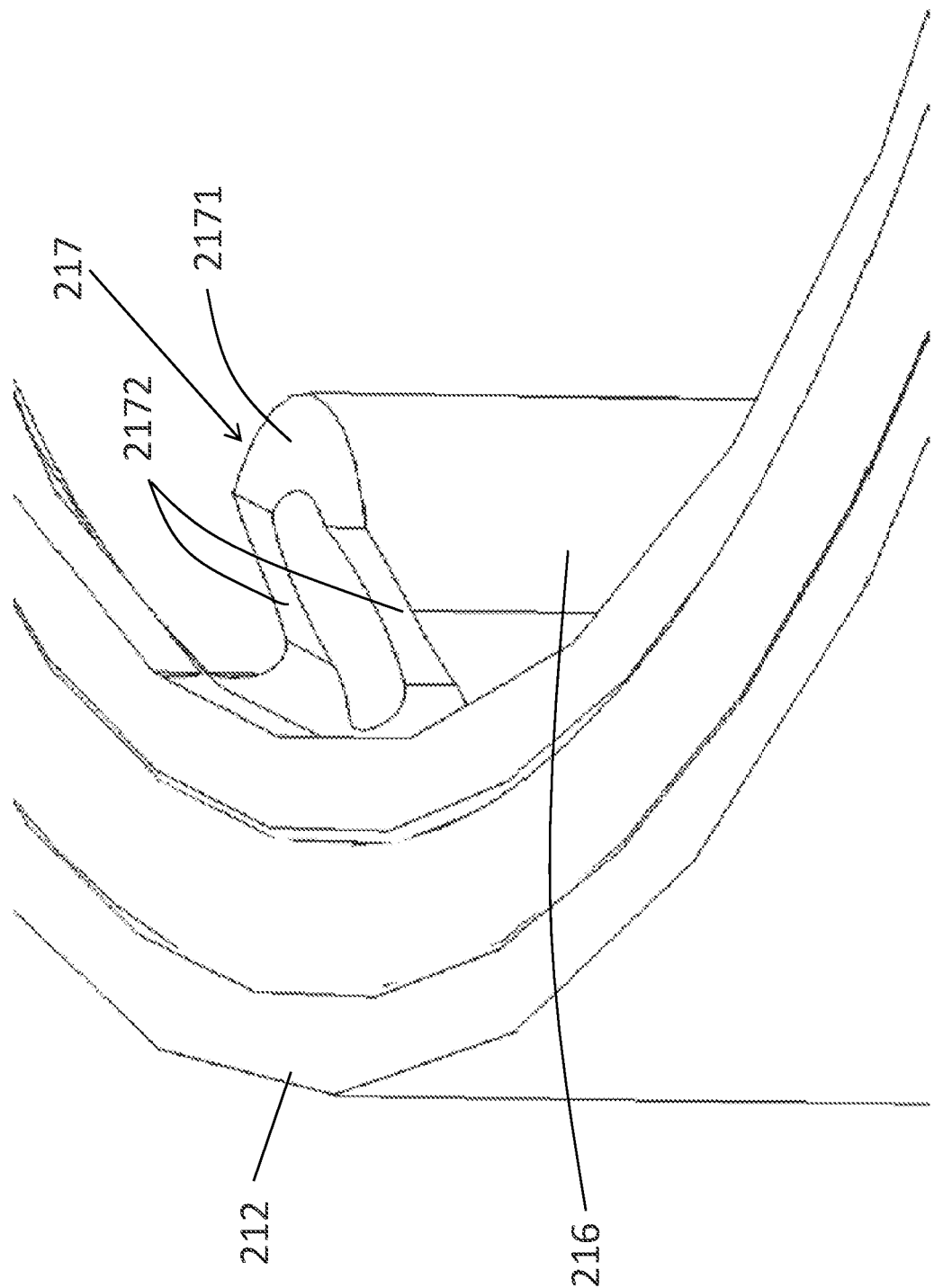
FIG. 6 is a partial enlarged view showing a top structure of a vent drain passage.
Figure 7:
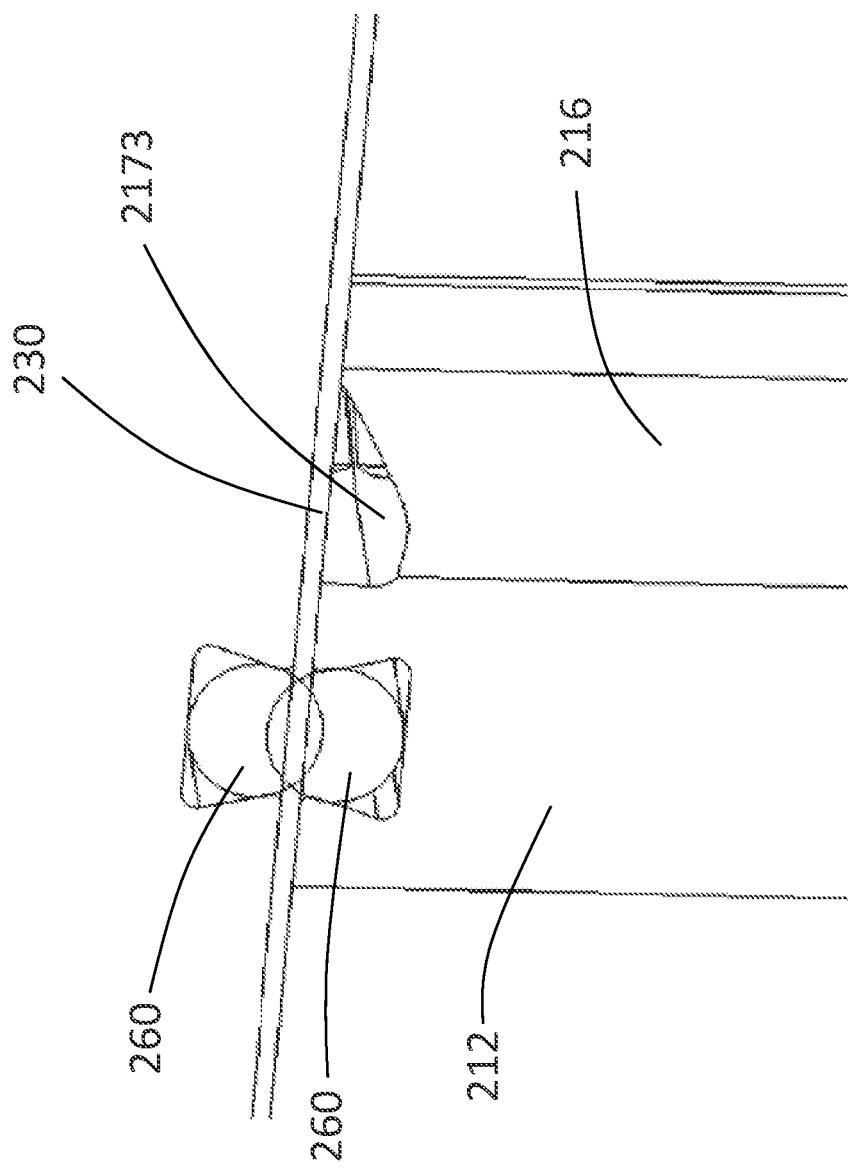
FIG. 7 is a partial enlarged view showing the vent drain passage.

Every independent anode zone 211 further has a vent drain outlet 215. Each vent drain outlet 215 connects to a vent drain passage 216. The vent drain passage 216 is set in the anode zone 211 and abuts the partition 212. The vent drain passage 216 has a top end 217 which is located at the highest point of the anode zone 211. As shown in FIG. 6 and FIG. 7, the top end 217 of the vent drain passage 216 has a first surface 2171 and a second surface 2172 connecting to the first surface 2171 and aslant downward extending. The first surface 2171 of the top end 217 of the vent drain passage 216 abuts against the membrane 230 and a vent drain inlet 2173 is formed between the membrane 230 and the second surface 2172 of the top end 217 of the vent drain passage 216. In the plating process, the electrolyte will be delivered into each anode zone 211 via the corresponding anolyte inlet 213 and drained via the vent drain inlet 2173, the vent drain passage 216 and the vent drain outlet 215. Bubbles mixing in the electrolyte will be collected at the highest point of the anode zone 211 and exhausted through the vent drain inlet 2173, the vent drain passage 216 and the vent drain outlet 215. The anolyte outlet 214 of each anode zone 211 is used to fully drain the electrolyte in the anode zone 211 out of the anode chamber 210 when the anode chamber 210 needs to refresh the electrolyte or do the maintenance.

Figure 8:
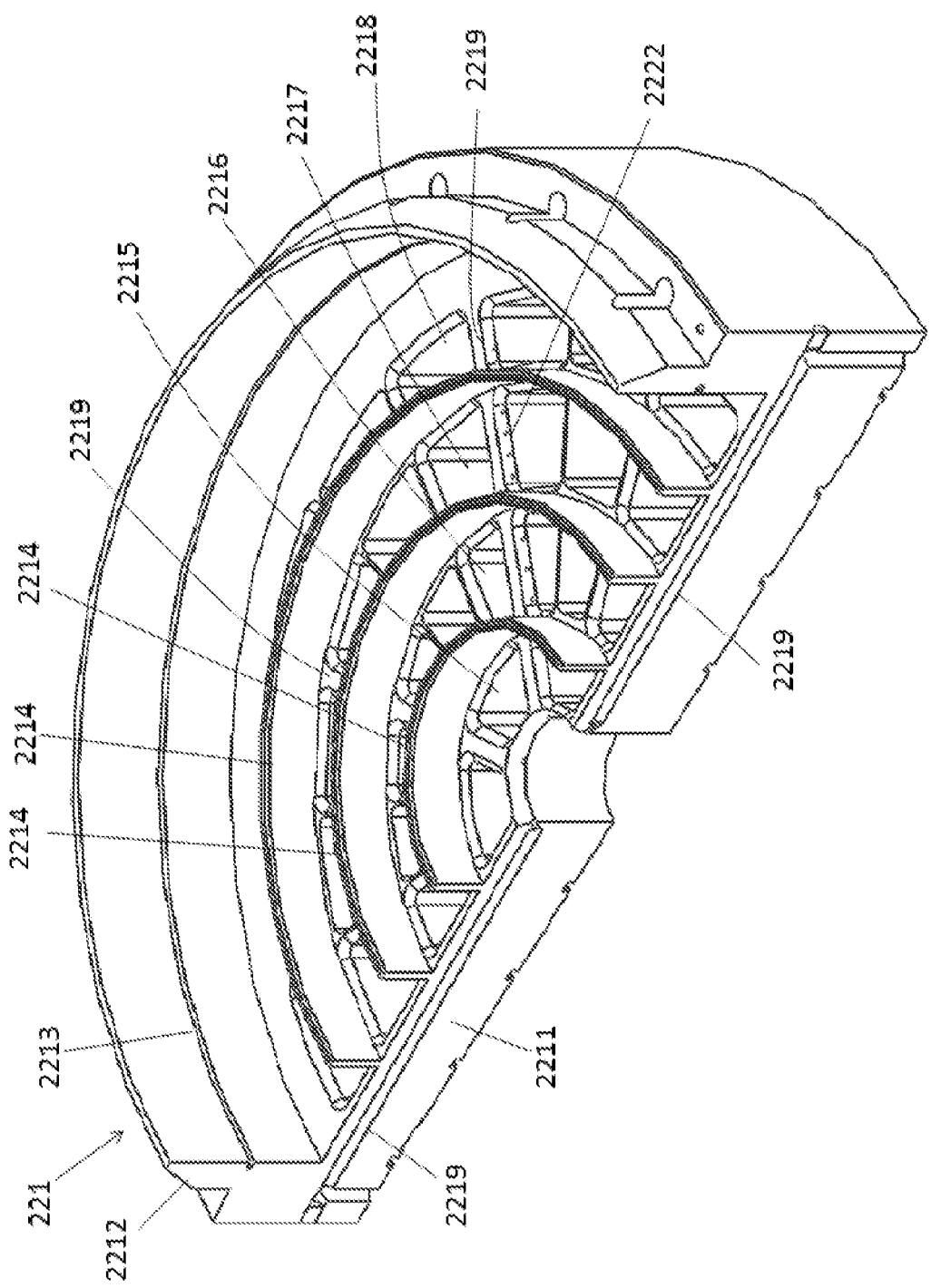
FIG. 8 is a cross-sectional view of a membrane frame.

With reference to FIG. 8, the membrane frame 221 configured to form the cathode chamber 220 has a base portion 2211 which is horizontally arranged on the top of the anode chamber 210. The base portion 2211 is a rigid perforated or meshed frame. The periphery of the base portion 2211 extends upward to form a side wall 2212. The base portion 2211 and the side wall 2212 compose the cathode chamber 220. The inner surface of the side wall 2212 defines a clamp slot 2213. A plurality of first separating walls 2214 is disposed on the top of the base portion 2211 to divide the cathode chamber 220 into multiple cathode zones. In an embodiment, there is three first separating walls 2214 to divide the cathode chamber 220 into four cathode zones which are respectively named as a first cathode zone 2215, a second cathode zone 2216, a third cathode zone 2217 and a fourth cathode zone 2218.

The base portion 2211 of the membrane frame 221 has a plurality of pairs of branch pipes 2219 for supplying plating solution into the cathode chamber 220. Each branch pipe 2219 extends from the edge of the base portion 2211 to the center of the base portion 2211 so that the flow direction of the plating solution in each branch pipe 2219 is from the edge to center of the base portion 2211. Each branch pipe 2219 is connected to a catholyte inlet 2221. Each branch pipe 2219 has a plurality of plating solution supply holes 2222. The plurality of supply holes 2222 on each branch pipe 2219 are divided into four groups and each group of supply holes 2222 is corresponding to one cathode zone. As shown in FIG. 11a, the density of the supply holes 2222 corresponding to the first cathode zone 2215, the second cathode zone 2216, the third cathode zone 2217 and the fourth cathode zone 2218 is same, but the diameter of the supply holes 2222 corresponding to the first cathode zone 2215, the second cathode zone 2216, the third cathode zone 2217 and the fourth cathode zone 2218 is different. The diameter of the supply holes 2222 gradually increases from the first cathode zone 2215 to the fourth cathode zone 2218. In another embodiment, as shown in FIG. 11b, the diameter of the supply holes 2222 corresponding to the first cathode zone 2215, the second cathode zone 2216, the third cathode zone 2217 and the fourth cathode zone 2218 is same, but the density of the supply holes 2222 corresponding to the first cathode zone 2215, the second cathode zone 2216, the third cathode zone 2217 and the fourth cathode zone 2218 is different. The density of the supply holes 2222 gradually increases from the first cathode zone 2215 to the fourth cathode zone 2218. The plating solution spray direction of each supply hole 2222 tilts an angle relative to a vertical plane. It can be seen from FIG. 8 that the plating solution is simultaneously supplied to the first cathode zone 2215, the second cathode zone 2216, the third cathode zone 2217 and the fourth cathode zone 2218 via each branch pipe 2219 so that the plating solution supply of the first cathode zone 2215, the second cathode zone 2216, the third cathode zone 2217 and the fourth cathode zone 2218 is non-independent control.

Please refer to FIG. 10 showing another embodiment of cathode plating solution supply. There is eight branch pipes 2219 symmetrically distributed on the base portion 2211. Every two opposite branch pipes 2219 having a plurality of plating solution supply holes 2222 form a pair of branch pipes for supplying the plating solution to one cathode zone. Therefore, there is four pairs of branch pipes 2219 configured to respectively supply the plating solution to the first cathode zone 2215, the second cathode zone 2216, the third cathode zone 2217 and the fourth cathode zone 2218. It can be seen from FIG. 10 that the plating solution supply holes 2222 of every pair of branch pipes 2219 are only corresponding to one cathode zone so that the plating solution supply of the first cathode zone 2215, the second cathode zone 2216, the third cathode zone 2217 and the fourth cathode zone 2218 is capable of being independently controlled, which can avoid electric field interference among the cathode zones.

The membrane 230 is attached on the bottom of the base portion 2211 of the membrane frame 221 for separating the anode chamber 210 and the cathode chamber 220. Only metal ions can transmit via the membrane 230 on specific direction, and the electrolyte and additives in the electrolyte cannot transmit via the membrane 230, guaranteeing there is only metal ions exchange between the anode chamber 210 and the cathode chamber 220.

Figure 9A:
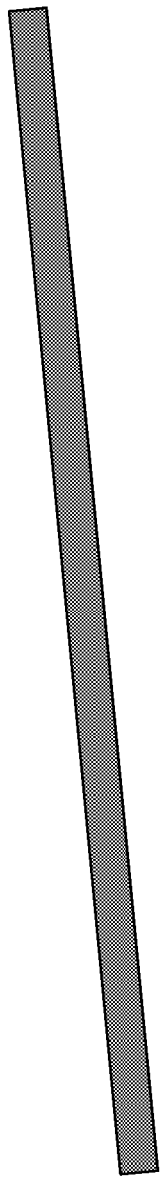
FIG. 9a to FIG. 9c show various bottom shapes of membrane frames.
Figure 9B:
Figure 9C:
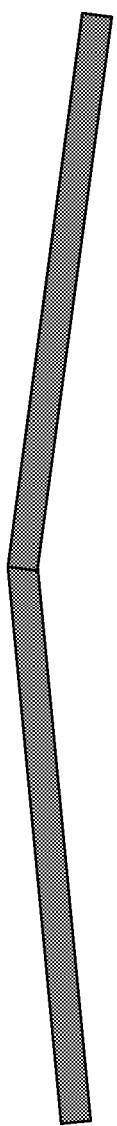

The bottom of the base portion 2211 of the membrane frame 221 can be designed in various shapes. For example, the bottom of the base portion 2211 is obliquely upward, as shown in FIG. 9a. Alternatively, the bottom of the base portion 2211 is substantially V-shaped, as shown in FIG. 9b, or the bottom of the base portion 2211 is substantially inverted V-shaped, as shown in FIG. 9c.

Figure 12:
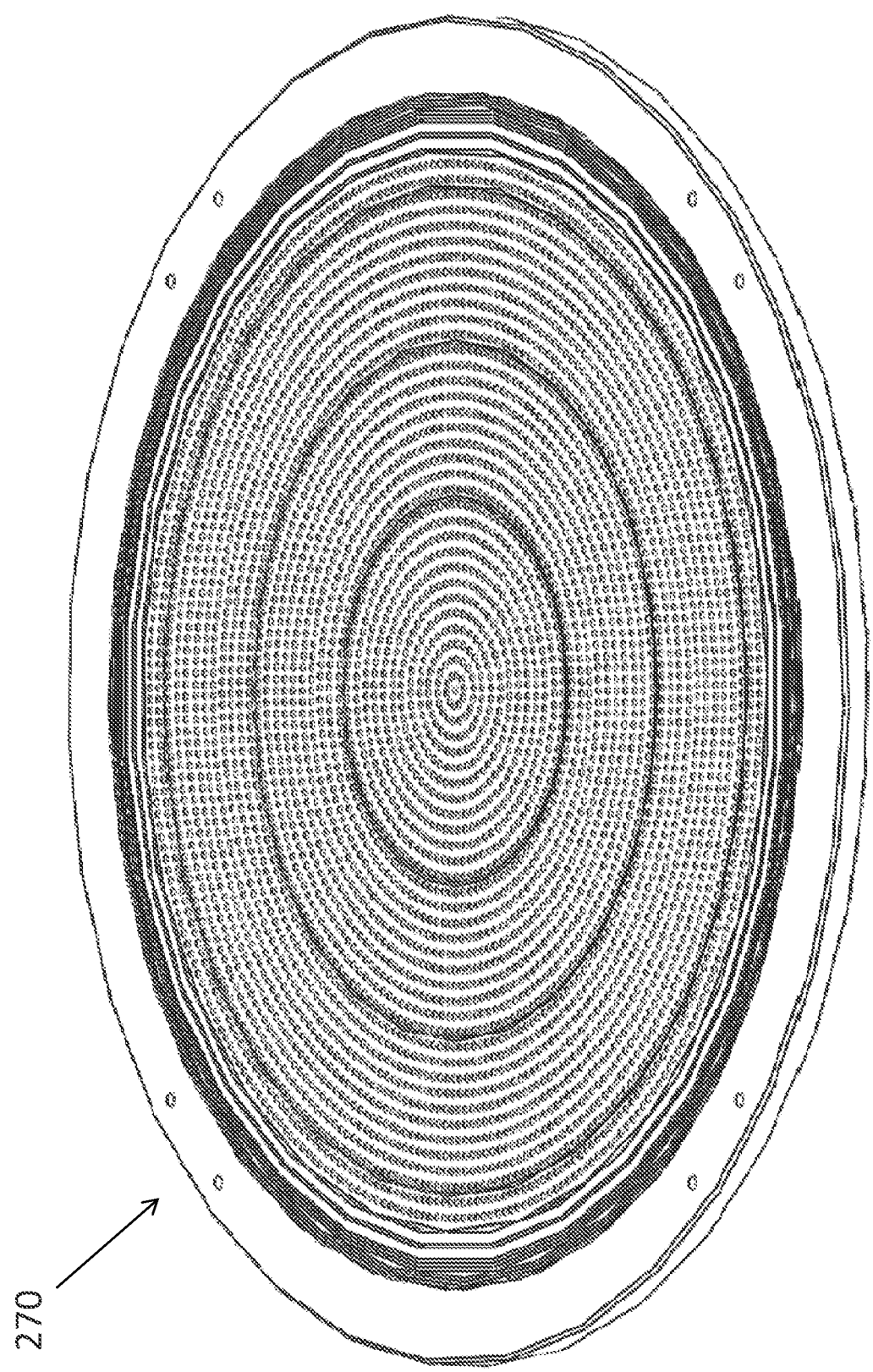
FIG. 12 is a perspective view of a diffusion plate.
Figure 13:
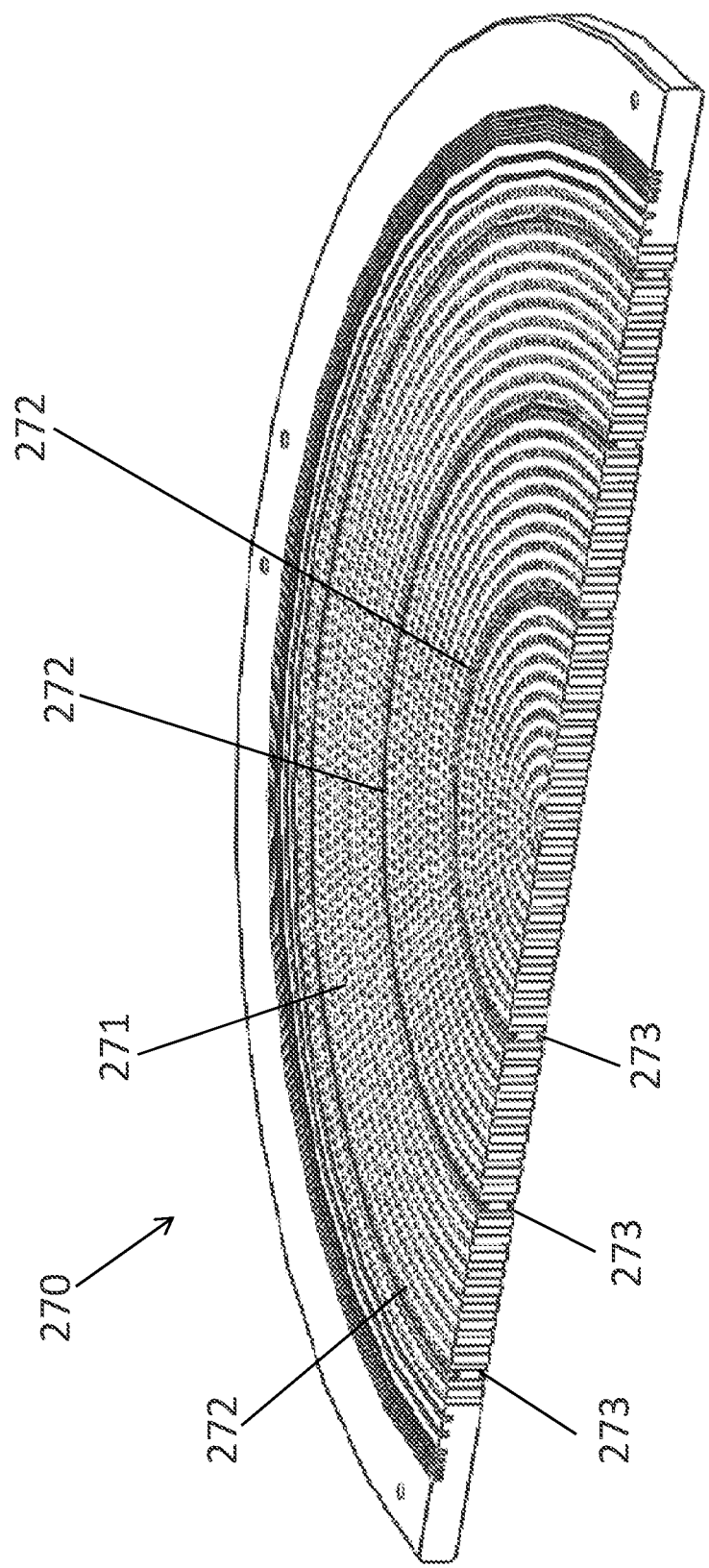
FIG. 13 is a cross-sectional view of the diffusion plate shown in FIG. 12.
Figure 14:
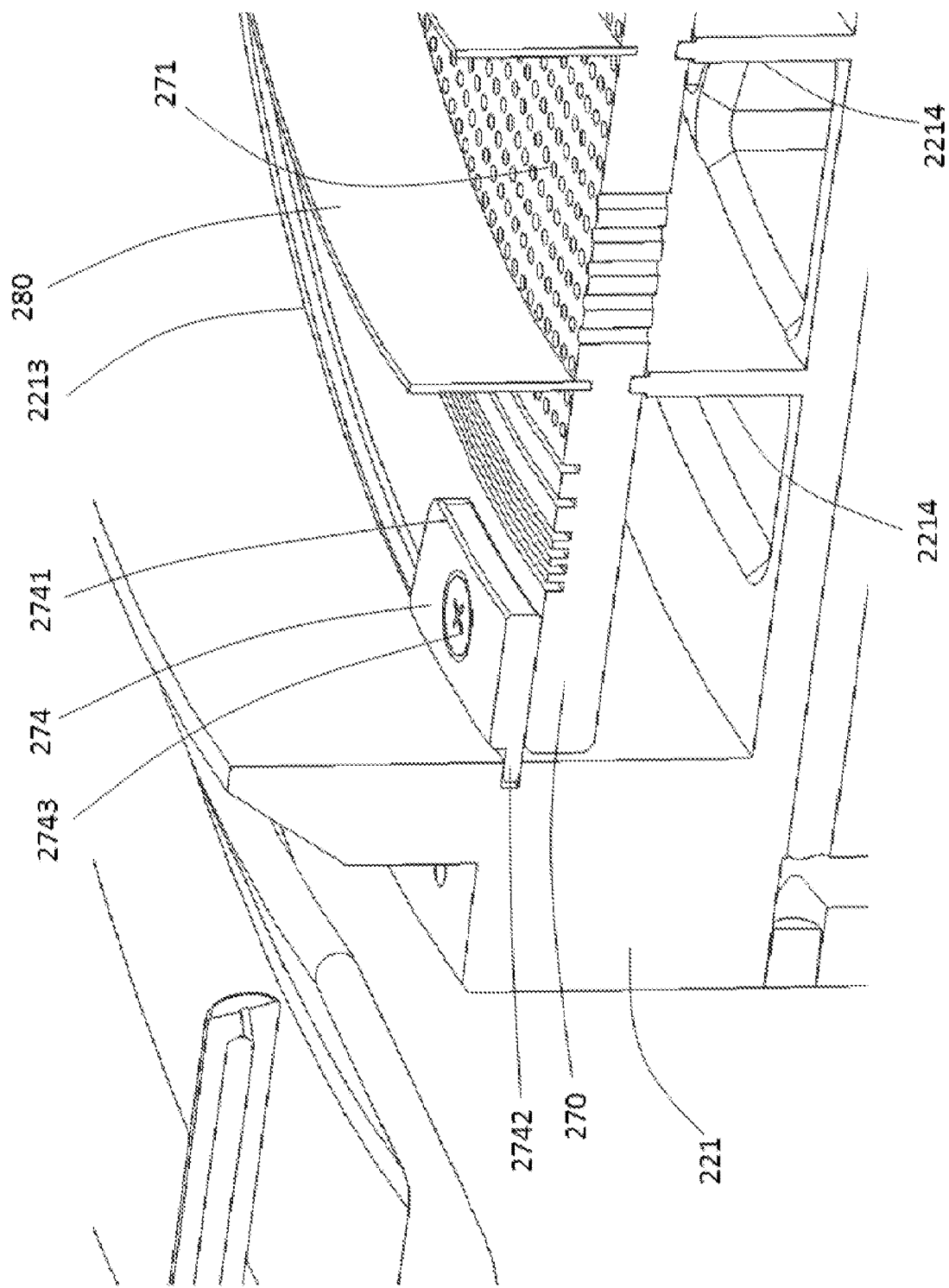
FIG. 14 is a partial enlarged view showing the installation of the diffusion plate.

A diffusion plate 270 is set in the cathode chamber 220. Referring to FIG. 12 to FIG. 14, the diffusion plate 270 has a mass of holes 271 passing therethrough. The size and distribution of the holes 271 determine the electrolyte mass field and electric field, which will finally influence the plating profile and system resistance. The top surface of the diffusion plate 270 defines a plurality of upper inserting slots 272. The plurality of upper inserting slots 272 are concentric rings. In an embodiment, the top surface of the diffusion plate 270 defines three upper inserting slots 272. The bottom surface of the diffusion plate 270 defines a plurality of lower inserting slots 273. The plurality of lower inserting slots 273 are concentric rings. The number of the lower inserting slots 273 matches with the number of the first separating walls 2214 of the membrane frame 221. The upper inserting slots 272 and the lower inserting slots 273 are one-to-one correspondence. In an embodiment, the bottom surface of the diffusion plate 270 defines three lower inserting slots 273. The plurality of first separating walls 2214 of the membrane frame 221 are respectively inserted in the plurality of lower inserting slots 273 of the diffusion plate 270, thus supporting the diffusion plate 270 in the cathode chamber 220. As shown in FIG. 14, a plurality of fixing members 274 are configured to fix the diffusion plate 270 in the cathode chamber 220. Specifically, every fixing member 274 has a fixing plate 2741 and an inserting plate 2742 protruding from a side wall of the fixing plate 2741. The inserting plate 2742 of the fixing member 274 is inserted in the clamp slot 2213 of the membrane frame 221 and a fixing screw 2743 is configured to fix the fixing plate 2741 and the edge of the diffusion plate 270. By this way, the diffusion plate 270 is fixed in the cathode chamber 220.

A plurality of second separating walls 280 is inserted and fixed in the upper inserting slots 272 of the diffusion plate 270 to divide the cathode chamber 220 into multiple cathode zones, benefitting the substrate edge plating profile control. In an embodiment, the number of the second separating walls 280 is three to divide the cathode chamber 220 into four cathode zones. The second separating walls 280 are made of non-conducting and anti-acidic material, such as PVC, PP, etc.

Figure 15A:
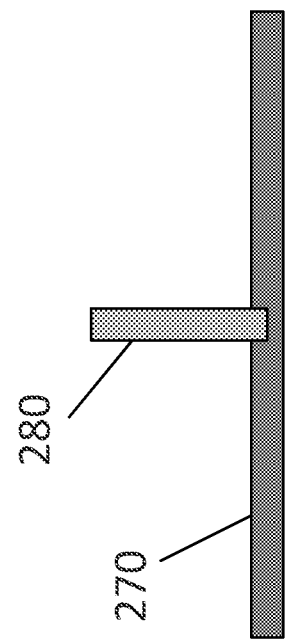
FIG. 15a and FIG. 15b show two ways that second separating walls are fixed on the diffusion plate.
Figure 15B:
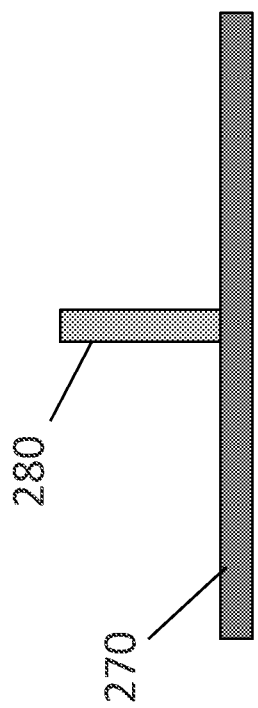

There are several ways to fix the second separating walls 280 on the top surface of the diffusion plate 270. Referring to FIG. 15a and FIG. 15b, FIG. 15a shows the second separating walls 280 are fixed on the top surface of the diffusion plate 270 by pasting or welding, and FIG. 15b shows the second separating walls 280 are fixed on the top surface of the diffusion plate 270 by inserting.

Figure 16C:
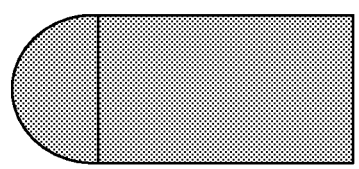
FIG. 16a to FIG. 16c show various shapes of second separating walls.
Figure 16B:
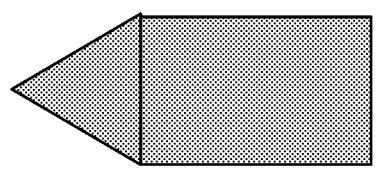
Figure 16A:
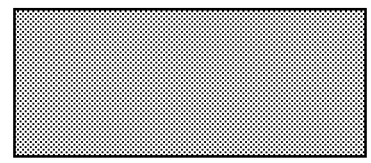

The thickness of the second separating walls 280 will influence the plating profile of the areas on the substrate which are over against the second separating walls 280 and the plated film thickness of these areas will be lower than the other areas on the substrate due to the electric filed above the second separating walls 280 is weaker, causing zone to zone plating profile boundary effect. Therefore, the second separating walls 280 with a thinner thickness are helpful to minimize the boundary effect. In an embodiment, the thickness of every second separating wall 280 is about 0.5 mm. And by optimizing the top shape of the second separating walls 280 also can weaken the boundary effect. Referring to FIG. 16a to FIG. 16c, various shapes of second separating walls are illustrated. FIG. 16a shows a second separating wall 280' having a rectangle top structure. FIG. 16b shows a second separating wall 280'' having a triangle top structure. FIG. 16c shows a second separating wall 280''' having an arc top structure. Obviously, a second separating wall having a triangle or arc top structure is better than a second separating wall having a rectangle top structure, and the former is more favorable to weakening the boundary effect.

Referring to FIG. 3 again, the peripheral chamber 240 encircles the anode chamber 210 and the cathode chamber 220. The peripheral chamber 240 has a plurality of catholyte outlets 241 distributed at the bottom of the peripheral chamber 240. The catholyte outlets 241 are connected to a catholyte tank. The cathode plating solution is supplied to the first cathode zone 2215, the second cathode zone 2216, the third cathode zone 2217 and the fourth cathode zone 2218 through the supply holes 2222 of the branch pipes 2219 and the cathode plating solution in the first cathode zone 2215, the second cathode zone 2216, the third cathode zone 2217 and the fourth cathode zone 2218 flows upward and passes through the diffusion plate 270. The plating solution of the cathode chamber 220 overflows from the cathode chamber 220 and is received in the peripheral chamber 240. The plating solution in the peripheral chamber 240 is drained through the catholyte outlets 241 and is received by the catholyte tank.

Figure 3:
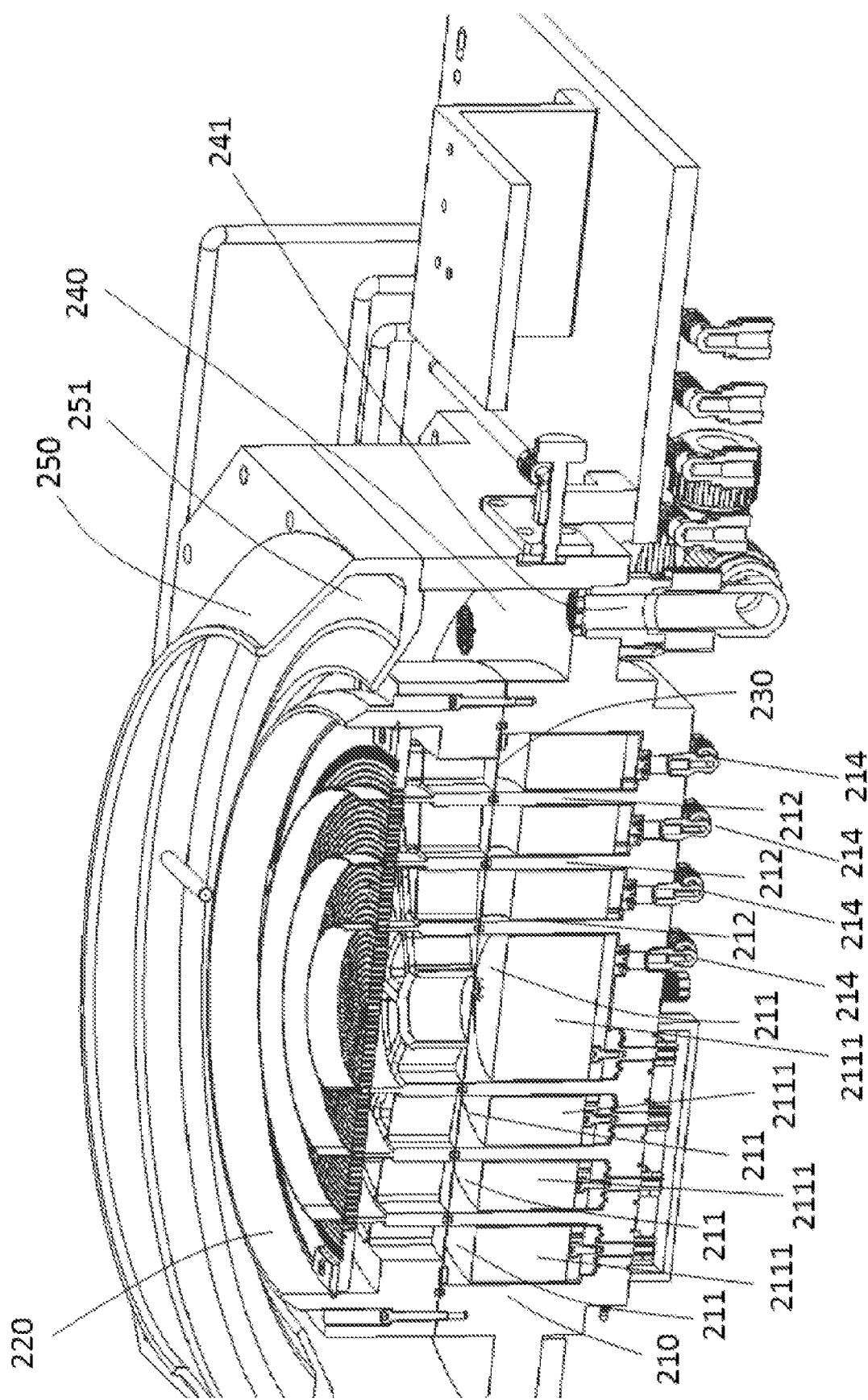
FIG. 3 is a cross-sectional view of the plating chamber assembly shown in FIG. 2.
Figure 5:
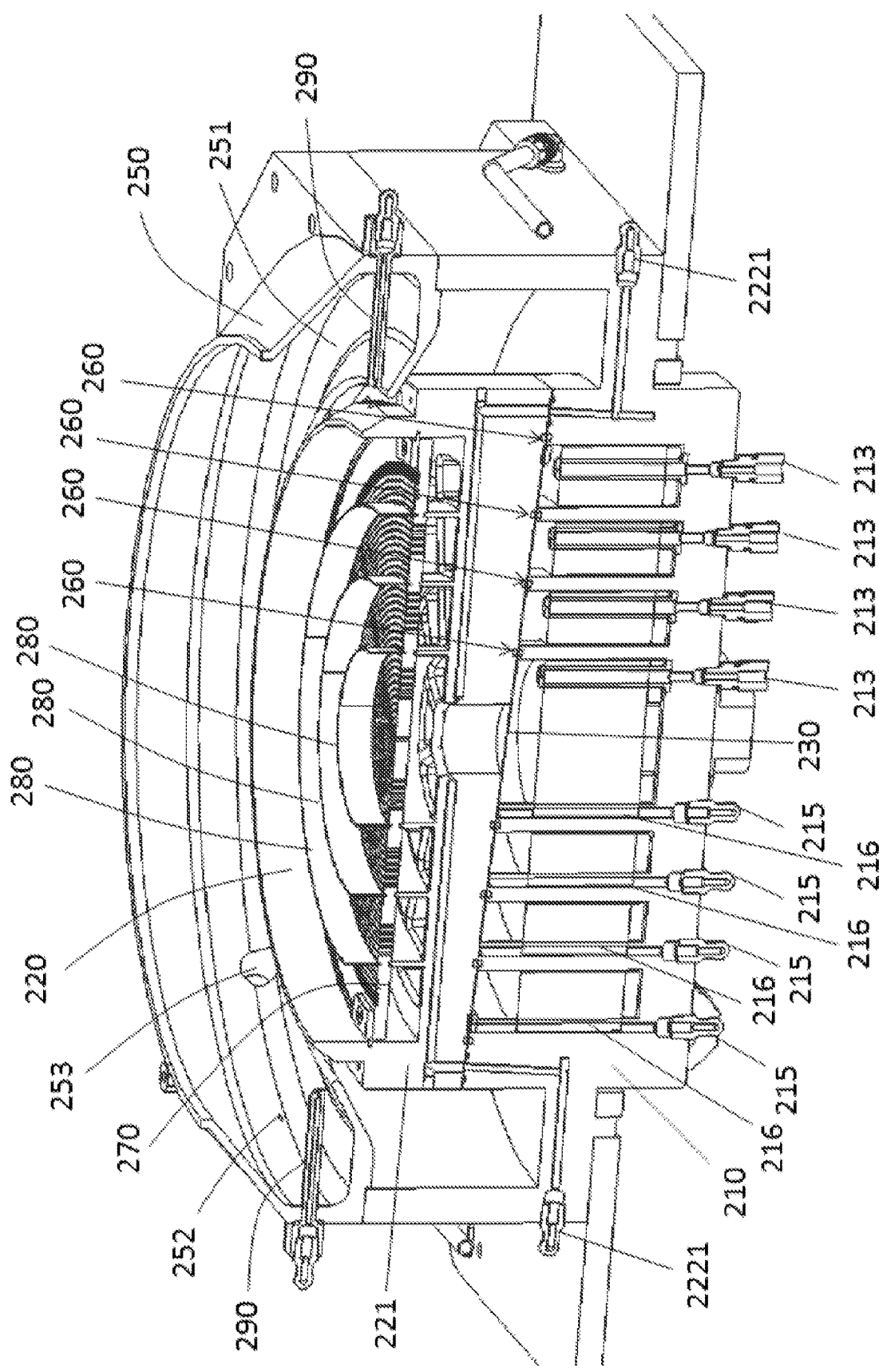
FIG. 5 is another cross-sectional view of the plating chamber assembly shown in FIG. 2.

Referring to FIG. 3 and FIG. 5, the shroud 250 is positioned on the top of the peripheral chamber 240 for avoiding the plating solution splash while the substrate is being plating. The shroud 250 has a collecting groove 251. The shroud 250 has a liquid inlet 252 and a liquid outlet 253 defined in the collecting groove 251. Cleaning liquid can be supplied to the collecting groove 251 through the liquid inlet 252 for cleaning the shroud 250. Liquid in the collecting groove 251 is drained through the liquid outlet 253.

At least one substrate rinse nozzle 290 is configured to clean the plated film on the substrate after the substrate has been plated, avoiding the electrolyte etching the plated film. FIG. 5 shows a pair of substrate rinse nozzles 290 for cleaning the plated film of the substrate. While cleaning the plated film, cleaning liquid is collected by the collecting groove 251 of the shroud 250 and drained through the liquid outlet 253 of the shroud 250.

A chuck cleaning nozzle 300 is configured to clean the chuck assembly 100. While cleaning the chuck assembly 100, cleaning liquid is collected by the collecting groove 251 of the shroud 250 and drained through the liquid outlet 253 of the shroud 250.

When the plating apparatus is used for plating metal layers on a substrate to form interconnection structures, the substrate 400 is transferred to the chuck assembly 100 which is configured to hold the substrate 400 for plating. The chuck assembly 100 is located above the plating chamber assembly 200. The substrate 400 has features of patterned structures, such as trenches, vias, etc. The chuck assembly 100 carries the substrate 400 and makes the substrate 400 submerge into the plating solution of the cathode chamber 220. The chuck assembly 100 is operable to make the substrate 400 tilt a pre-set angle relative to a horizontal plane and rotate at a pre-set speed during the process of the substrate 400 entering the plating solution of the cathode chamber 220, and at the same time, the chuck assembly 100 is operable to make the substrate 400 move downward to be submerged into the plating solution of the cathode chamber 220. In the substrate 400 submersion process, the chuck assembly 100 is operable to make the substrate 400 gradually become horizontal and finally become absolutely horizontal when the substrate 400 is fully immersed into the plating solution of the cathode chamber 220.

Figure 17:
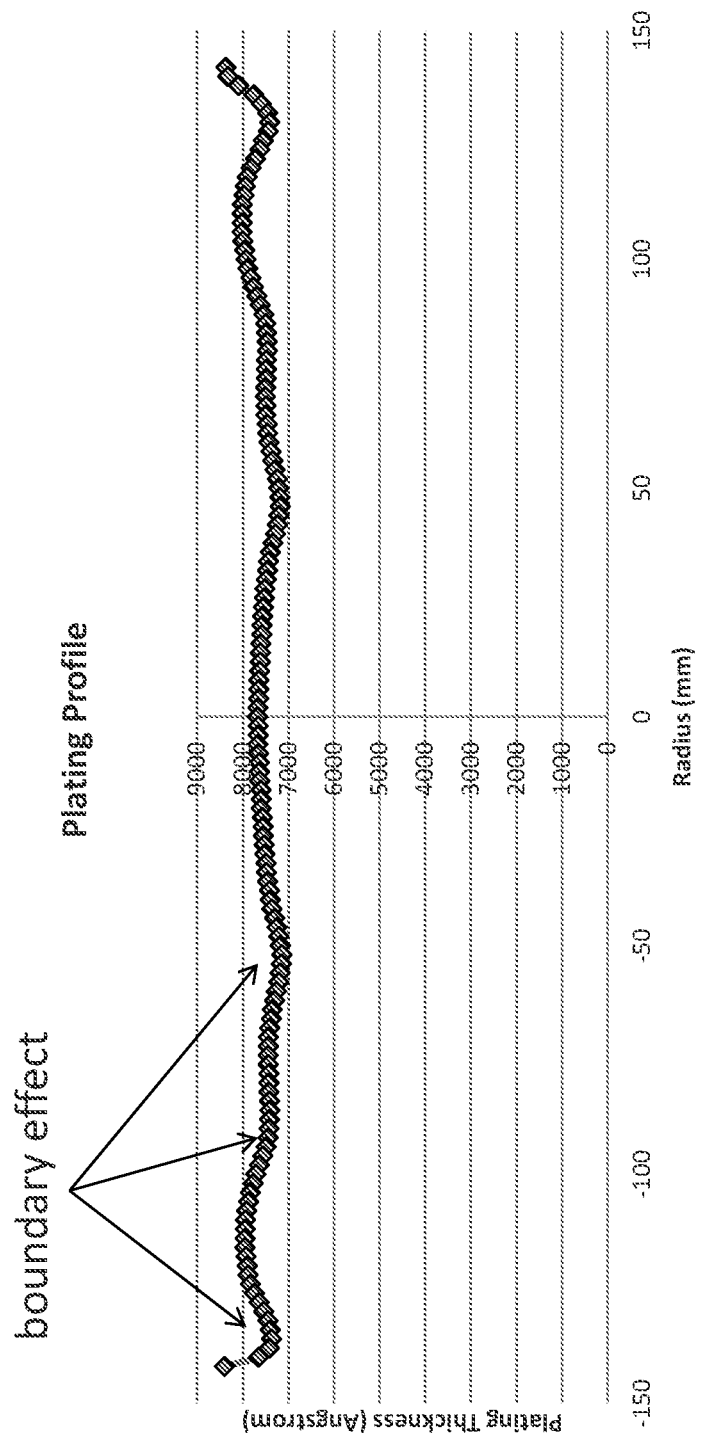
FIG. 17 shows a plating profile under the condition that the center of a substrate has alignment with the center of the cathode chamber.
Figure 18:
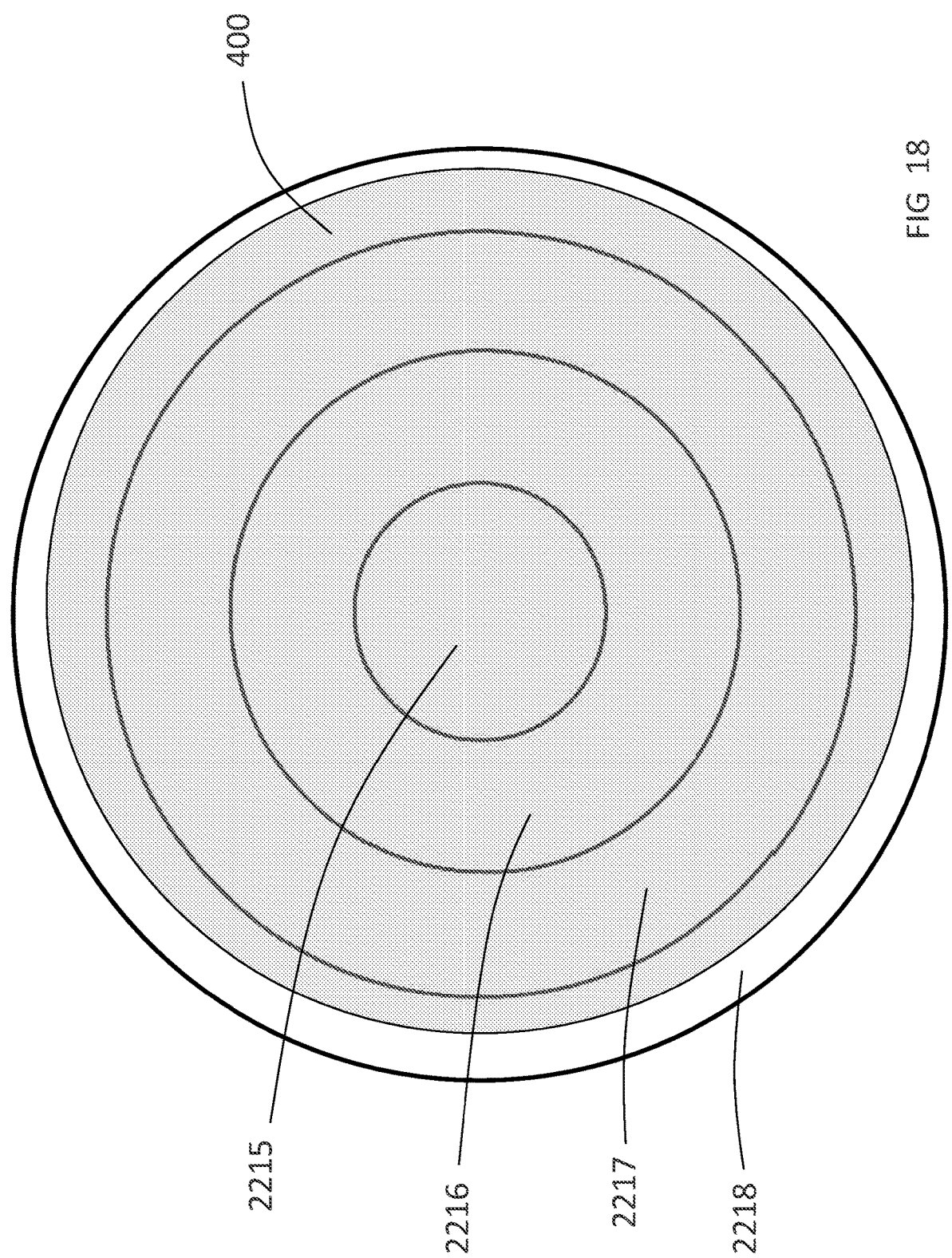
FIG. 18 shows the center of a substrate has misalignment with the center of the cathode chamber.
Figure 19:
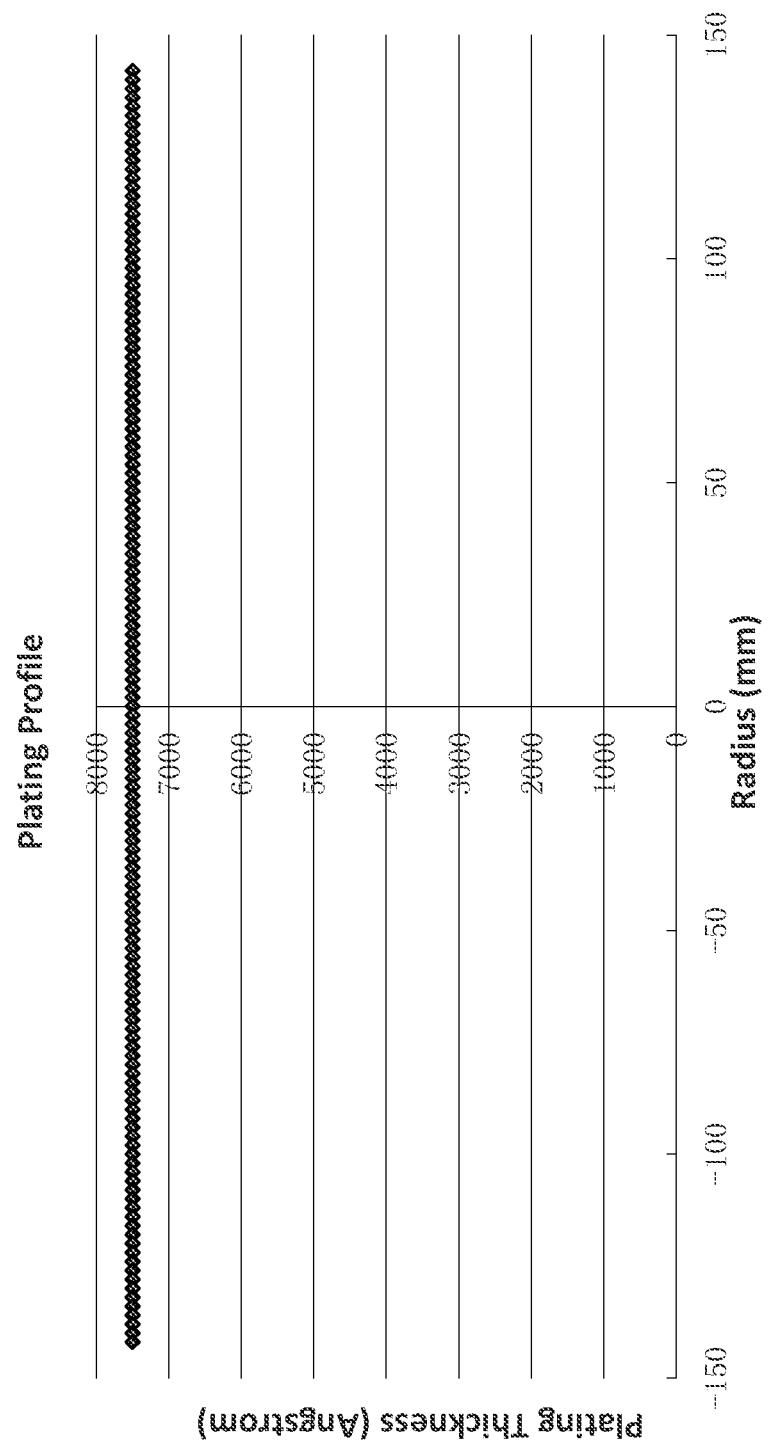
FIG. 19 shows a plating profile under the condition that the center of the substrate has misalignment with the center of the cathode chamber.

Referring to FIG. 18, during the substrate 400 plating process, preferably, the center of the substrate 400 has misalignment with the center of the cathode chamber 220, so as to minimize or even eliminate the boundary effect induced by the second separating walls 280. FIG. 17 shows a plating profile under the condition that the center of the substrate 400 has alignment with the center of the cathode chamber 220. FIG. 19 shows a plating profile under the condition that the center of the substrate 400 has misalignment with the center of the cathode chamber 220. It can be seen from FIG. 17 in case that the center of the substrate 400 has alignment with the center of the cathode chamber 220 during the substrate 400 plating process, the zone to zone plating profile boundary effect appears on the substrate 400. On the contrary, in case that the center of the substrate 400 has misalignment with the center of the cathode chamber 220, the zone to zone plating profile boundary effect disappears, as shown in FIG. 19.

The gap between the substrate 400 and the top end of the second separating walls 280 is critical for plating rate and plating profile control. The small gap is more beneficial to single zone plating profile control. The plating current of each zone will just act on its zone, and there is minimal current cross talking between zones. The larger gap is beneficial to achieving a smooth plating profile. Therefore, after the filling of trenches, vias, etc., patterned structures of the substrate 400 is completed, while implementing the subsequent overburden metal layer plating, preferably, the gap between the substrate 400 and the top end of the second separating walls 280 can be adjusted to a large gap. The gap normally is set in the range of 1 mm to 20 mm during the plating process.

Figure 20:
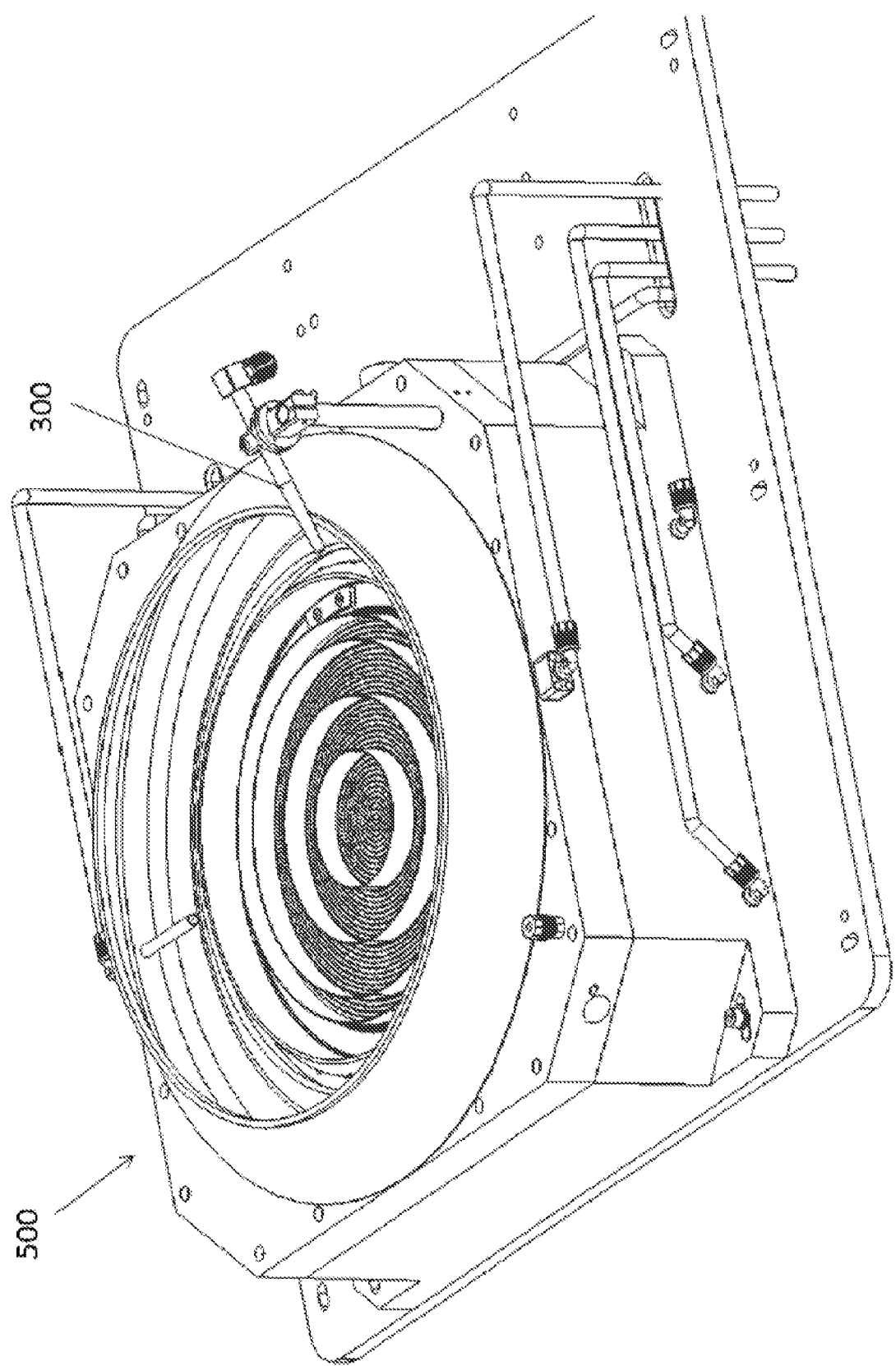
FIG. 20 is a perspective view of a plating chamber assembly according to another exemplary embodiment of the present invention.
Figure 21:
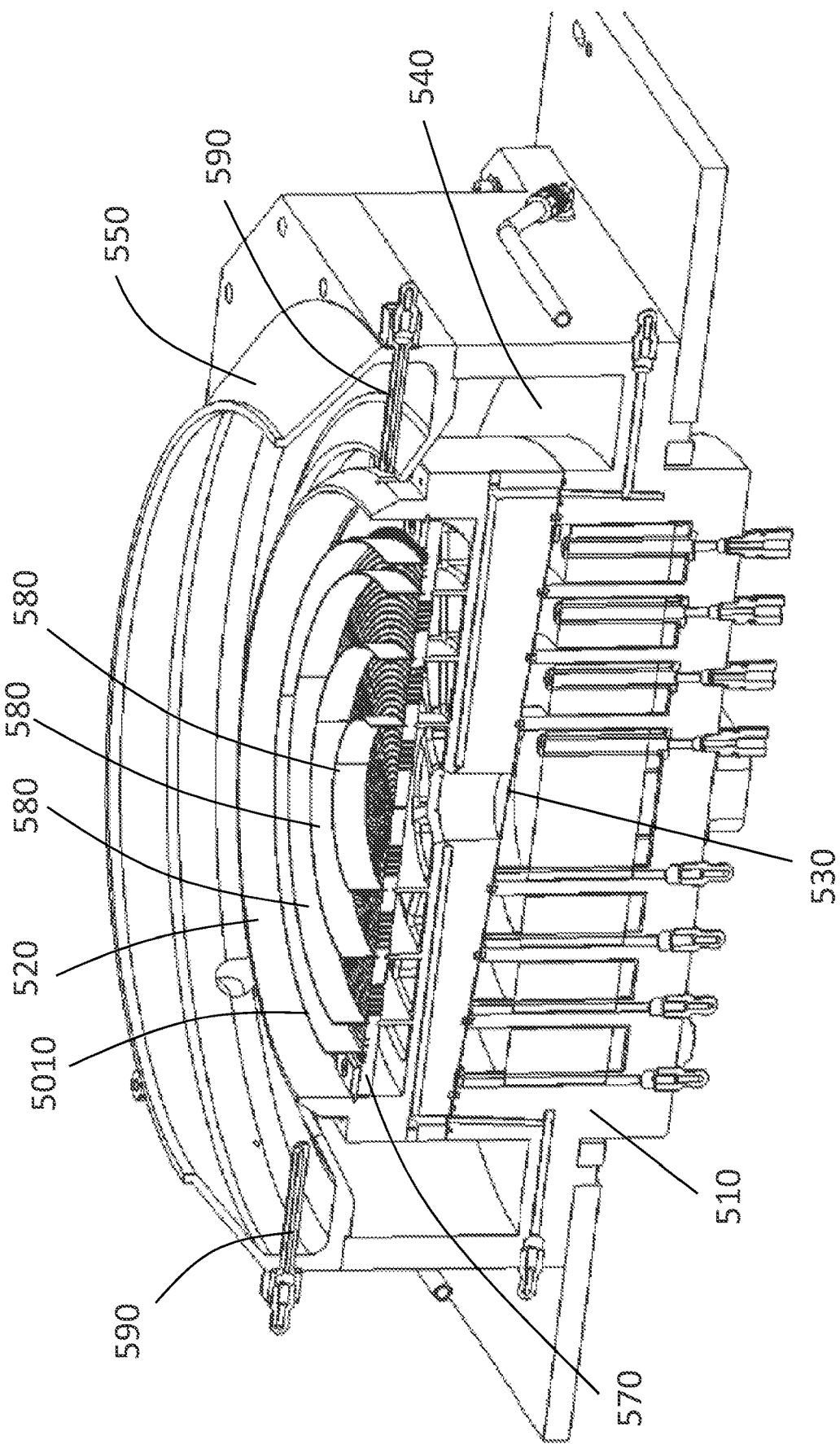
FIG. 21 is a cross-sectional view of the plating chamber assembly shown in FIG. 20.
Figure 22:
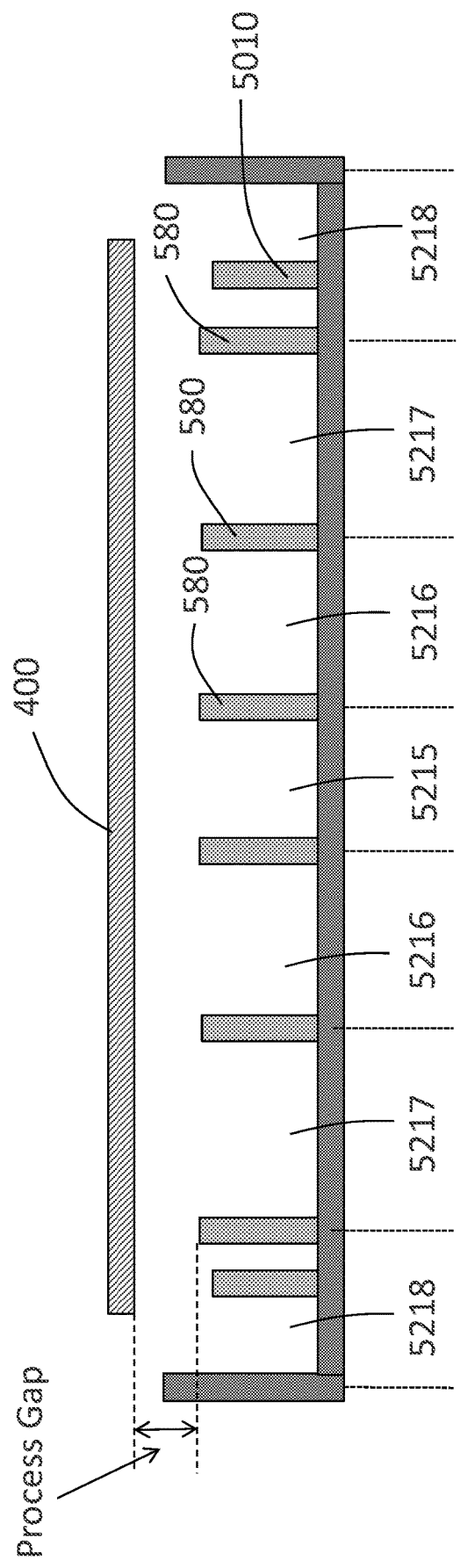
FIG. 22 is a simplified schematic view showing a gap between a substrate and second separating walls while the substrate is being plated.
Figure 23:
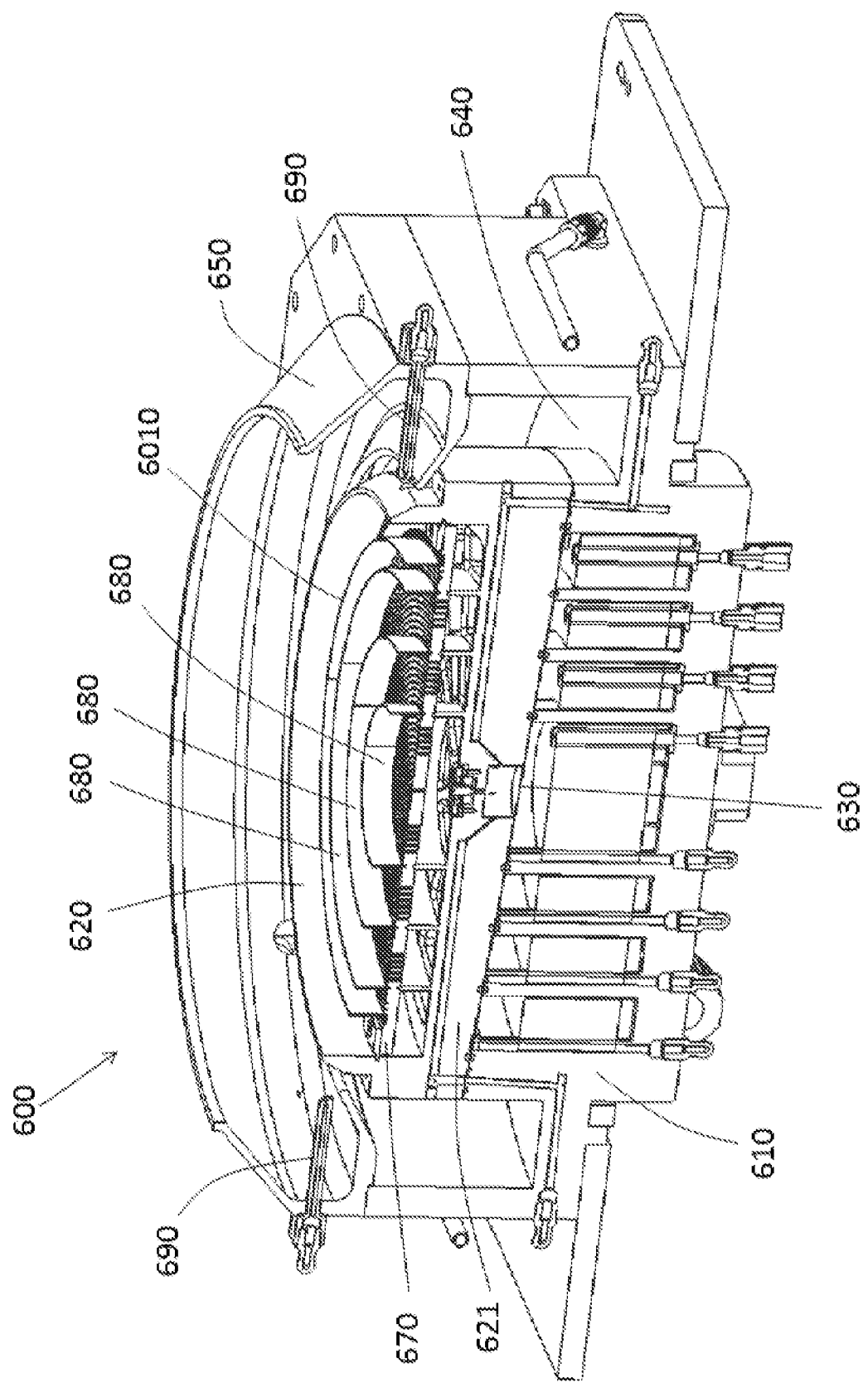
FIG. 23 is a cross-sectional view of a plating chamber assembly according to yet another exemplary embodiment of the present invention.

Referring to FIG. 20 to FIG. 22, a plating chamber assembly 500 according to another exemplary embodiment of the present invention is illustrated. The plating chamber assembly 500 includes an anode chamber 510, a cathode chamber 520 setting on the top of the anode chamber 510, a membrane 530 separating the anode chamber 510 and the cathode chamber 520, a peripheral chamber 540 encircling the anode chamber 510 and the cathode chamber 520, a shroud 550 setting on the top of the peripheral chamber 540, a diffusion plate 570 setting in the cathode chamber 520, a plurality of second separating walls 580 fixed on the diffusion plate 570, and at least one substrate rinse nozzle 590 configured to clean the plated film on the substrate after the substrate has been plated, all of which are as same as the plating chamber assembly 200. The plating chamber assembly 500 is similar to the plating chamber assembly 200, and the difference between the plating chamber assembly 500 and the plating chamber assembly 200 is that the plating chamber assembly 500 has a third separating wall 5010. The third separating wall 5010 is fixed on the peripheral edge of the diffusion plate 570 and between the outermost second separating wall 580 and the side wall of the cathode chamber 520. The height of the third separating wall 5010 is lower than the height of the second separating walls 580. As shown in FIG. 22, in an embodiment, there is three second separating walls 580 to divide the cathode chamber 520 into four cathode zones which are respectively named as a first cathode zone 5215, a second cathode zone 5216, a third cathode zone 5217 and a fourth cathode zone 5218. The third separating wall 5010 is set in the fourth cathode zone 5218 for adjusting the plating profile on the peripheral edge of the substrate 400. The height of the third separating wall 5010 is lower than the height of the second separating walls 580, which is convenient for the substrate 400 entry into the plating solution of the cathode chamber 520. The top surface of the diffusion plate 570 defines a plurality of third inserting slots, and the third separating wall 5010 is optionally inserted in one of the third inserting slots for adjusting the plating profile on the peripheral edge of the substrate 400.

Referring to FIG. 23 to FIG. 27, a plating chamber assembly 600 according to yet another exemplary embodiment of the present invention is illustrated. The plating chamber assembly 600 includes an anode chamber 610, a cathode chamber 620 setting on the top of the anode chamber 610, a membrane 630 separating the anode chamber 610 and the cathode chamber 620, a peripheral chamber 640 encircling the anode chamber 610 and the cathode chamber 620, a shroud 650 setting on the top of the peripheral chamber 640, a diffusion plate 670 setting in the cathode chamber 620, a plurality of second separating walls 680 fixed on the diffusion plate 670, a third separating wall 6010 fixed on the peripheral edge of the diffusion plate 670, and at least one substrate rinse nozzle 690 configured to clean the plated film on the substrate after the substrate has been plated. The plating chamber assembly 600 is similar to the plating chamber assembly 500, and compared to the plating chamber assembly 500, the plating chamber assembly 600 further includes a center cap 6020 and an adjustable member 6030. The center cap 6020 and the adjustable member 6030 are disposed at the center of a membrane frame 621 which is fixed on the top of the anode chamber 610 and configured to form the cathode chamber 620, so as to improve the uniformity of plating solution flow and the electric field at the substrate center range. The membrane 630 is attached on the bottom of the membrane frame 621 to separate the anode chamber 610 and the cathode chamber 620.

Figure 24:
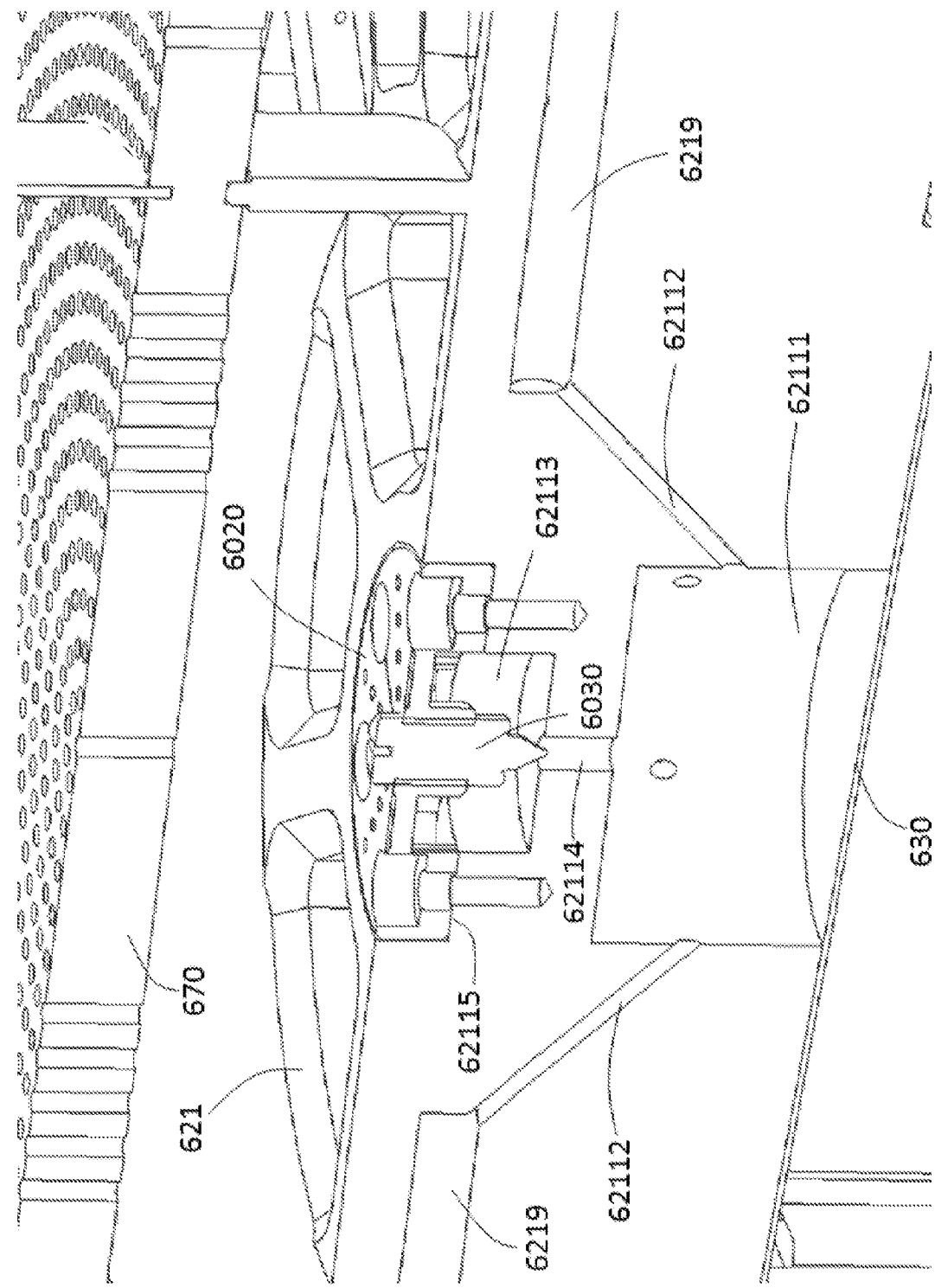
FIG. 24 is a partial enlarged view showing the center flow adjustment of the plating chamber assembly shown in FIG. 23.

As shown in FIG. 24, the center of the bottom of the membrane frame 621 defines a first cavity 62111. The bottom opening of the first cavity 62111 is covered by the membrane 630 so that there is only metal ions exchange between the first cavity 62111 and an anode zone which is located at the center of the anode chamber 610. The first cavity 62111 is connected to a plurality of branch pipes 6219 through a plurality of channels 62112 which are defined in the membrane frame 621. The plating solution is supplied to the first cavity 62111 via the plurality of branch pipes 6219 and the plurality of channels 62112. The center of the top of the membrane frame 621 defines a second cavity 62113. The second cavity 62113 is connected to the first cavity 62111 through a connecting passage 62114. The top of the second cavity 62113 extends outward so as to form a step portion 62115. The center cap 6020 is supported by the step portion 62115. The center cap 6020 is fixed on the step portion 62115 by a plurality of screws.

Figure 25:
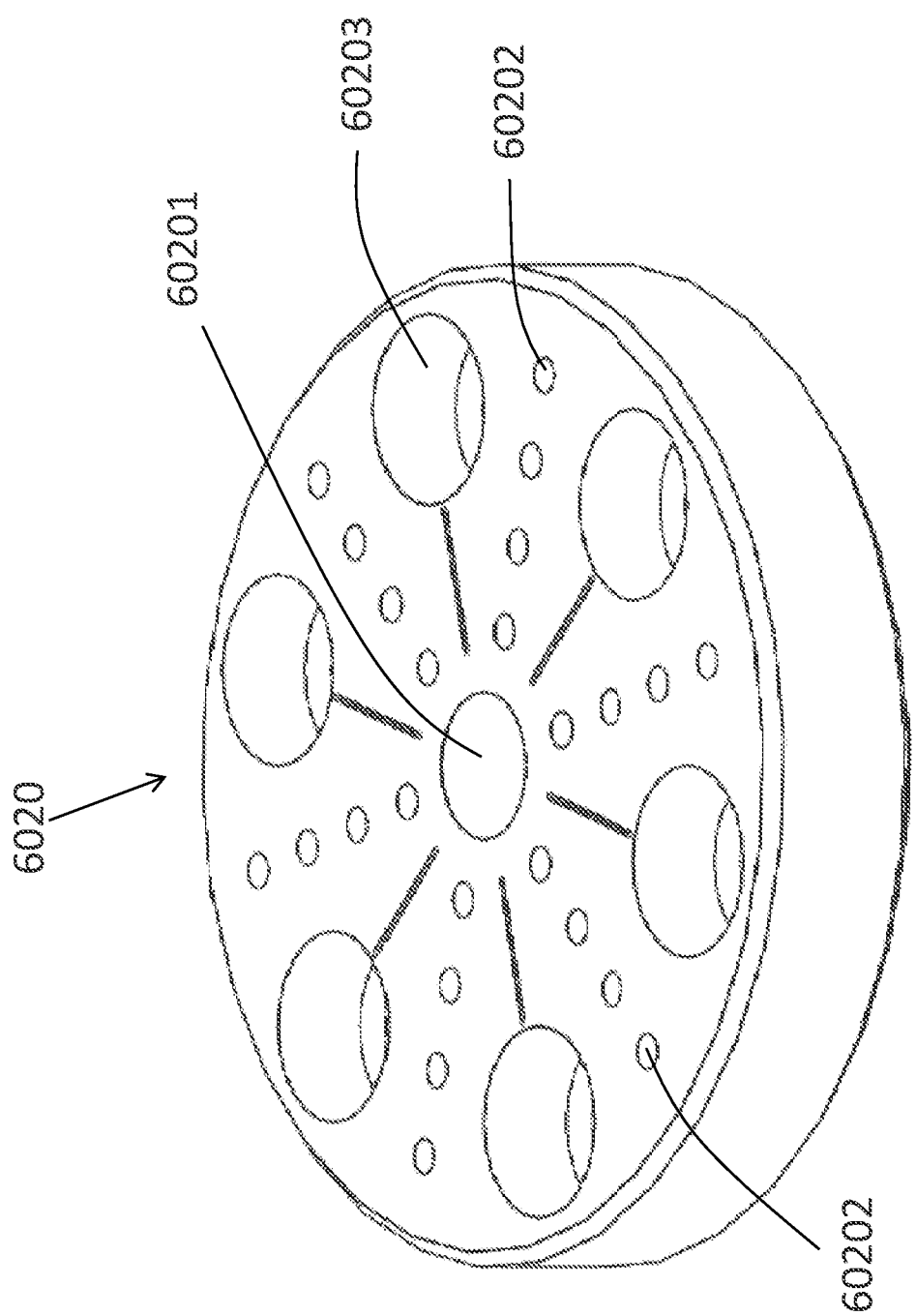
FIG. 25 is a perspective view of a center cap.
Figure 26:
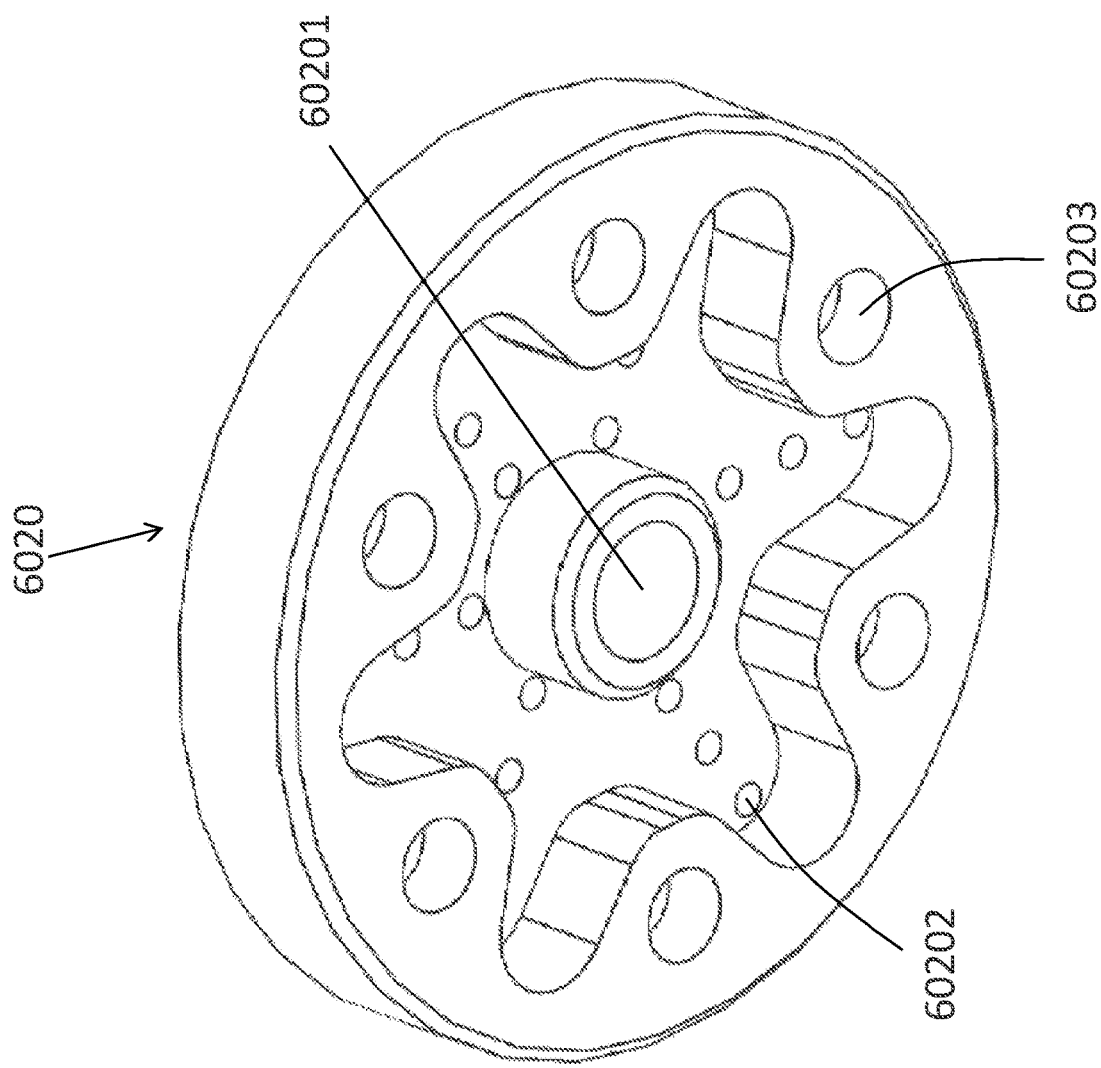
FIG. 26 is another perspective view of the center cap.

Please refer to FIG. 25 and FIG. 26 illustrating an example of the center cap 6020. The center cap 6020 has a center hole 60201 passing through the center of the center cap 6020. The center cap 6020 has a plurality of orifices 60202 which are arranged radially on the center cap 6020 for flow uniform distribution. The diameter of the orifices 60202 can be the same or different. Since on the substrate, with the increase of radius, the area increases so that need more flow to meet the plating mass transfer. Therefore, preferably, the diameter of the orifices 60202 gradually increases from the center to edge of the center cap 6020. Alternatively, the density of the orifices 60202 on the center cap 6020 can be the same or different. Preferably, the density of the orifices 60202 gradually increases from the center to edge of the center cap 6020. The center cap 6020 has a plurality of mounting holes 60203. The plurality of screws is respectively inserted in the mounting holes 60203 of the center cap 6020 and the step portion 62115 of the membrane frame 621 to fix the center cap 6020 on the step portion 62115. Preferably, an o-ring is set between the center cap 6020 and the step portion 62115.

Figure 27:
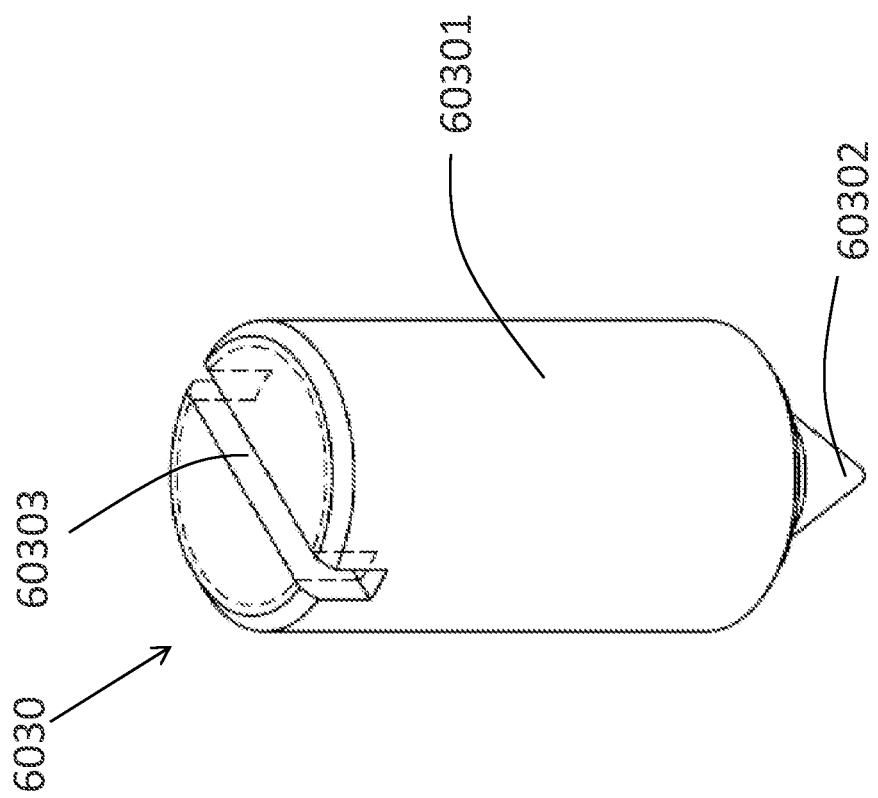
FIG. 27 is a perspective view of an adjustable member.

FIG. 27 illustrates an example of the adjustable member 6030. The adjustable member 6030 is configured to regulate the flow of plating solution supplied to the center cap 6020, further regulating the flow of plating solution supplied to the center range of the substrate. The adjustable member 6030 is inserted in the center hole 60201 of the center cap 6020 and located at the top end of the connecting passage 62114 of the membrane frame 621 for center flow control. The adjustable member 6030 is capable of completely blocking the top end of the connecting passage 62114 of the membrane frame 621 so that the plating solution cannot be supplied to the center cap 6020. By gradually raising the adjustable member 6030 upward, the top opening of the connecting passage 62114 is gradually opened so that the plating solution is supplied to the center cap 6020. Therefore, the flow of plating solution supplied to the center range of the substrate is capable of being regulated by raising or descending the adjustable member 6030. According to an embodiment, the adjustable member 6030 has a base body 60301 and a blocking component 60302 formed at the bottom of the base body 60301. The base body 60301 is cylinder-shaped. The blocking component 60302 is inverted cone-shaped. The top of the base body 60301 defines a groove-shaped opening 60303 for conveniently rotating the adjustable member 6030 by using a tool such as a screw driver so that the adjustable member 6030 moves upward or downward in the center hole 60201 of the center cap 6020 for regulating the flow of plating solution supplied to the center cap 6020, further regulating the flow of plating solution supplied to the center range of the substrate. It can be seen that the flow of plating solution supplied to the center cap 6020 is controlled independently by the adjustable member 6030.

Figure 28:
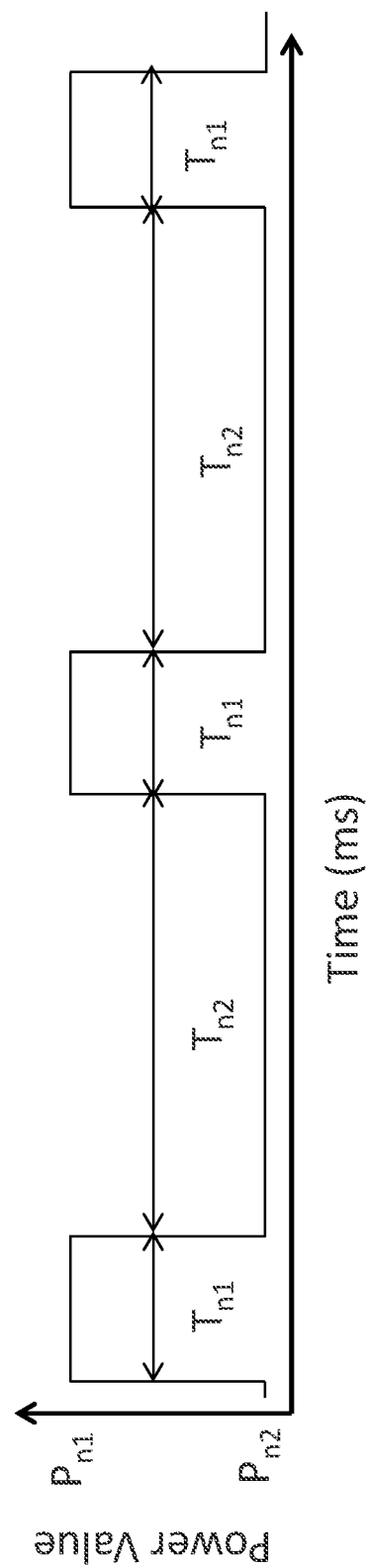
FIG. 28 is a waveform diagram of an output of a plating power supply applied on each anode according to the present invention.

Please refer to FIG. 28 illustrating an output of a plating power supply applied on each anode. The plating power supply can be a pulse power supply.

Although not illustrated in the drawings, a controller is provided and configured to control the plating power supplies to operate in different modes. The controller may be connected to the respective plating power supplies and the controller may be configured to control the plating power supplies to operate as follows:

Combined with FIG. 29, the plating power supply applied on each anode can be set to the following modes:

The mode $M_{OA1}$: within every time period $T_{n1}$, the output of the plating power supply is current. The power value $P_{n1}$ is a low value which is lower than 1 ASD. The "$_n$" represents the serial number of the anode. The pulse length, that is the time period $T_{n1}$, is short, which is lower than 10 ms. Within every time period $T_{n2}$, the output of the plating power supply is zero. The pulse length, that is the time period $T_{n2}$, is short, which is lower than 10 ms. By taking the mode $M_{OA1}$, a seed layer on the substrate can be protected, avoiding the seed layer surface being etched or uncontrollable galvanic reactions by plating solution.

The mode $M_{OA2}$: within every time period $T_{n1}$, the output of the plating power supply is voltage. The power value $P_{n1}$ is a low value which is lower than 1 ASD. The pulse length, that is the time period $T_{n1}$, is short, which is lower than 10 ms. Within every time period $T_{n2}$, the output of the plating power supply is zero. The pulse length, that is the time period $T_{n2}$, is short, which is lower than 10 ms. By taking the mode $M_{OA2}$, a seed layer on the substrate can be protected, avoiding the seed layer surface being etched or uncontrollable galvanic reactions by plating solution.

The mode $M_{OB1}$: within every time period $T_{n1}$, the output of the plating power supply is current. The power value $P_{n1}$ is a low value which is lower than 1 ASD. The pulse length, that is the time period $T_{n1}$, is long, which is greater than 10 ms. Within every time period $T_{n2}$, the output of the plating power supply is zero. The pulse length, that is the time period $T_{n2}$, is long, which is greater than 10 ms. While plating narrow lines, the defect of PVD (physical vapor deposition) process may cause the seed layer deposition on side walls of the narrow lines is not consecutive and uniform, which will induce the plating failure on the side walls of the narrow lines and form some voids when the subsequent plating process is implemented. For solving the problem, it is preferable to repair the seed layers on patterned structures of the substrate before plating metal layers on the seed layers. By taking the mode $M_{OB1}$, the seed layers on the patterned structures of the substrate can be repaired. Because the output of the plating power supply is a low current, within the time periods $T_{n1}$, additives in the plating solution are not activated so that the plating is a conformal plating process, which causes the bottoms and side walls of the patterned structures to be uniformly plated a thin metal layer, which will optimize the seed layer uniformity on the patterned structures.

The mode $M_{OB2}$: within every time period $T_{n1}$, the output of the plating power supply is voltage. The power value $P_{n1}$ is a low value which is lower than 1 ASD. The pulse length, that is the time period $T_{n1}$, is long, which is greater than 10 ms. Within every time period $T_{n2}$, the output of the plating power supply is zero. The pulse length, that is the time period $T_{n2}$, is long, which is greater than 10 ms. Similarly with the mode $M_{OB1}$, by taking the mode $M_{OB2}$, the seed layer on the patterned structures of the substrate can be repaired.

The mode $M_1$: within every time period $T_{n1}$, the output of the plating power supply is current. The power value $P_{n1}$ is a high value which is greater than 1 ASD. The pulse length, that is the time period $T_{n1}$, is long, which is greater than 10 ms. Within every time period $T_{n2}$, the output of the plating power supply is current. The power value $P_{n2}$ is zero. The pulse length, that is the time period $T_{n2}$, is long, which is greater than 10 ms. By taking the mode $M_1$, cooperating with additives, within time periods $T_{n1}$, a bottom-up plating is formed to fill the patterned structures. In the patterned structures, the vertical direction plating rate is accelerated, and the horizontal direction plating rate is suppressed.

The mode $M_2$: within every time period $T_{n1}$, the output of the plating power supply is current. The power value $P_{n1}$ is a high value which is greater than 1 ASD. The pulse length, that is the time period $T_{n1}$, is long, which is greater than 10 ms. Within every time period $T_{n2}$, the output of the plating power supply is a low current that is lower than 1 ASD. The pulse length, that is the time period $T_{n2}$, is long, which is greater than 10 ms. By taking the mode $M_2$, within time periods $T_{n1}$, a bottom-up plating is formed to fill the patterned structures, and within time periods $T_{n2}$, the seed layer on the patterned structures can be repaired.

The mode $M_3$: within every time period $T_{n1}$, the output of the plating power supply is current. The power value $P_{n1}$ is a high value which is greater than 1 ASD. The pulse length, that is the time period $T_{n1}$, is long, which is greater than 10 ms. Within every time period $T_{n2}$, the output of the plating power supply is a low voltage with no current. The current value is 0 ASD. The pulse length, that is the time period $T_{n2}$, is long, which is greater than 10 ms. By taking the mode $M_3$, within time periods $T_{n1}$, a bottom-up plating is formed to fill the patterned structures, and within time periods $T_{n2}$, the seed layer on the patterned structures is protected, avoiding the seed layer surface being etched or uncontrollable galvanic reactions by plating solution.

The mode $M_4$: within every time period $T_{n1}$, the output of the plating power supply is current. The power value $P_{n1}$ is a high value which is greater than 1 ASD. The pulse length, that is the time period $T_{n1}$, is long, which is greater than 10 ms. Within every time period $T_{n2}$, the output of the plating power supply is a low voltage with a low current that is lower than 1 ASD. The pulse length, that is the time period $T_{n2}$, is long, which is greater than 10 ms. By taking the mode $M_4$, within time periods $T_{n1}$, a bottom-up plating is formed to fill the patterned structures, and within time periods $T_{n2}$, the seed layer on the patterned structures can be repaired.

The mode $M_5$: within every time period $T_{n1}$, the output of the plating power supply is voltage. The power value $P_{n1}$ is a high value which is greater than 1 ASD. The pulse length, that is the time period $T_{n1}$, is long, which is greater than 10 ms. Within every time period $T_{n2}$, the output of the plating power supply is a low voltage with no current. The current value is 0 ASD. The pulse length, that is the time period $T_{n2}$, is long, which is greater than 10 ms. By taking the mode $M_5$, within time periods $T_{n1}$, a bottom-up plating is formed to fill the patterned structures, and within time periods $T_{n2}$, the seed layer on the patterned structures is protected, avoiding the seed layer surface being etched or uncontrollable galvanic reactions by plating solution.

The mode $M_6$: within every time period $T_{n1}$, the output of the plating power supply is voltage. The power value $P_{n1}$ is a high value which is greater than 1 ASD. The pulse length, that is the time period $T_{n1}$, is long, which is greater than 10 ms. Within every time period $T_{n2}$, the output of the plating power supply is a low voltage with a low current that is lower than 1 ASD. The pulse length, that is the time period $T_{n2}$, is long, which is greater than 10 ms. By taking the mode $M_6$, within time periods $T_{n1}$, a bottom-up plating is formed to fill the patterned structures, and within time periods $T_{n2}$, the seed layer on the patterned structures can be repaired.

In the modes $M_{OA1}$ to $M_6$, both the current and the voltage are converted to current density to be described. Normally all anode zones will be set the same current density, but according to the flow and electric field distribution, the current correction of each anode zone is necessary for actual application.

According to the modes $M_{OA1}$ to $M_6$, the present invention provides plating methods for plating metal layers on a substrate to form, for example, interconnection structures.

Figure 30:
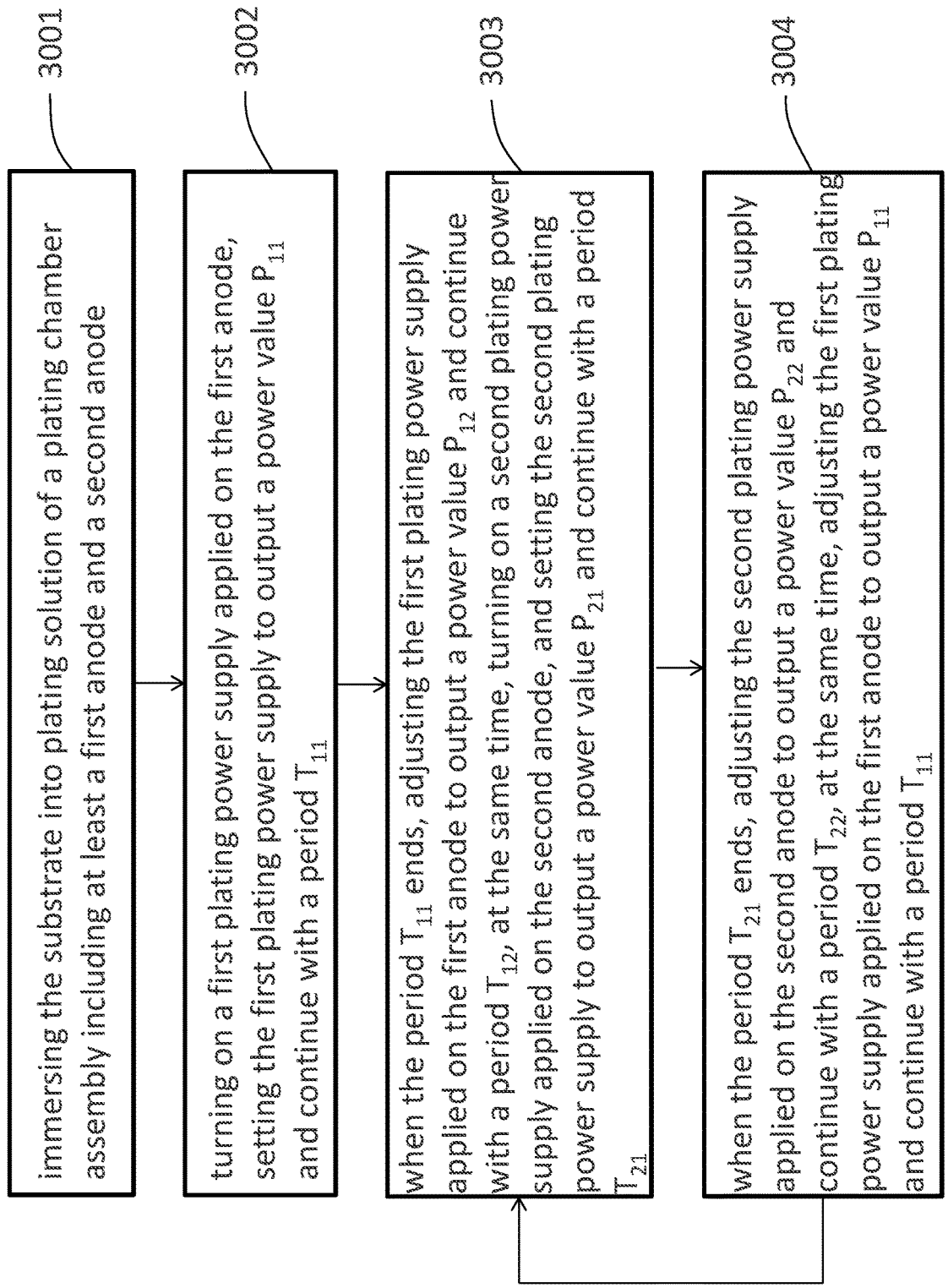
FIG. 30 is a flow chart of a plating method according to an exemplary embodiment of the present invention.
Figure 32:
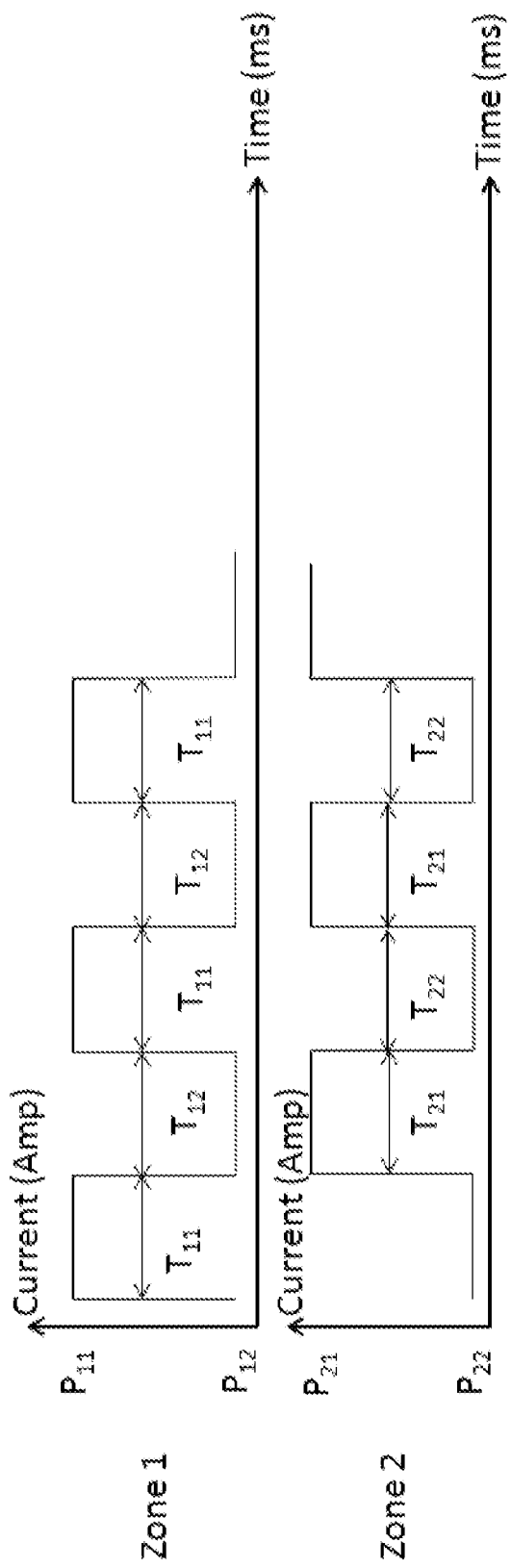
FIG. 32 is a waveform diagram for partial plating according to the present invention.

Referring to FIG. 30 and FIG. 32, a plating method according to an embodiment of the present invention is illustrated. The plating method for plating metal layers on a substrate comprising features of patterned structures includes the following steps:

Step 3001: immersing the substrate into plating solution of a plating chamber assembly including at least a first anode and a second anode;

Step 3002: turning on a first plating power supply applied on the first anode, setting the first plating power supply to output a power value $P_{11}$ and continue with a period $T_{11}$;

Step 3003: when the period $T_{11}$ ends, adjusting the first plating power supply applied on the first anode to output a power value $P_{12}$ and continue with a period $T_{12}$, at the same time, turning on a second plating power supply applied on the second anode, and setting the second plating power supply to output a power value $P_{21}$ and continue with a period $T_{21}$; and Step 3004: when the period $T_{21}$ ends, adjusting the second plating power supply applied on the second anode to output a power value $P_{22}$ and continue with a period $T_{22}$, at the same time, adjusting the first plating power supply applied on the first anode to output a power value $P_{11}$ and continue with a period $T_{11}$;

wherein step 3003 to step 3004 are performed periodically. That the first plating power supply is controlled to continuously output a power value $P_{11}$ with a period $T_{11}$ and a power value $P_{12}$ with a period $T_{12}$ can be defined one cycle.

In an embodiment, the power value $P_{12}$ is less than the power value $P_{11}$, the power value $P_{22}$ is less than the power value $P_{21}$.

In an embodiment, there is a time interval between adjusting the first plating power supply to output a power value $P_{12}$ and setting the second plating power supply to output a power value $P_{21}$.

In an embodiment, there is a time interval between adjusting the second plating power supply to output a power value $P_{22}$ and setting the first plating power supply to output a power value $P_{11}$.

In an embodiment, when the step 3002 to the step 3005 are performed, different modes are applied, the different modes have different combinations of power types, power values and length of periods, the modes are selected according to the phases of the plating process.

In an embodiment, the first plating power supply and the second plating power supply are turned on in sequence, and the period $T_{11}$ and the period $T_{21}$ are adjustable, therefore, the plating film thickness corresponding to anode zones accommodating the first anode and the second anode is controlled.

The power value $P_{12}$ and the power value $P_{22}$ are zero or respectively a set value.

The period $T_{11}$ and the period $T_{21}$ are respectively in the range of 0.01 ms to 2000 ms.

The period $T_{12}$ and the period $T_{22}$ are respectively in the range of 0.01 ms to 2000 ms.

In an embodiment, the first plating power supply and the second plating power supply are a pulse direct current.

In another embodiment, the first plating power supply and the second plating power supply are a pulse direct voltage.

In yet another embodiment, during the period $T_{11}$ and the period $T_{21}$, the first plating power supply and the second plating power supply are a pulse direct current, and during the period $T_{12}$ and the period $T_{22}$, the first plating power supply and the second plating power supply are a pulse direct voltage with a set value.

Figure 31:
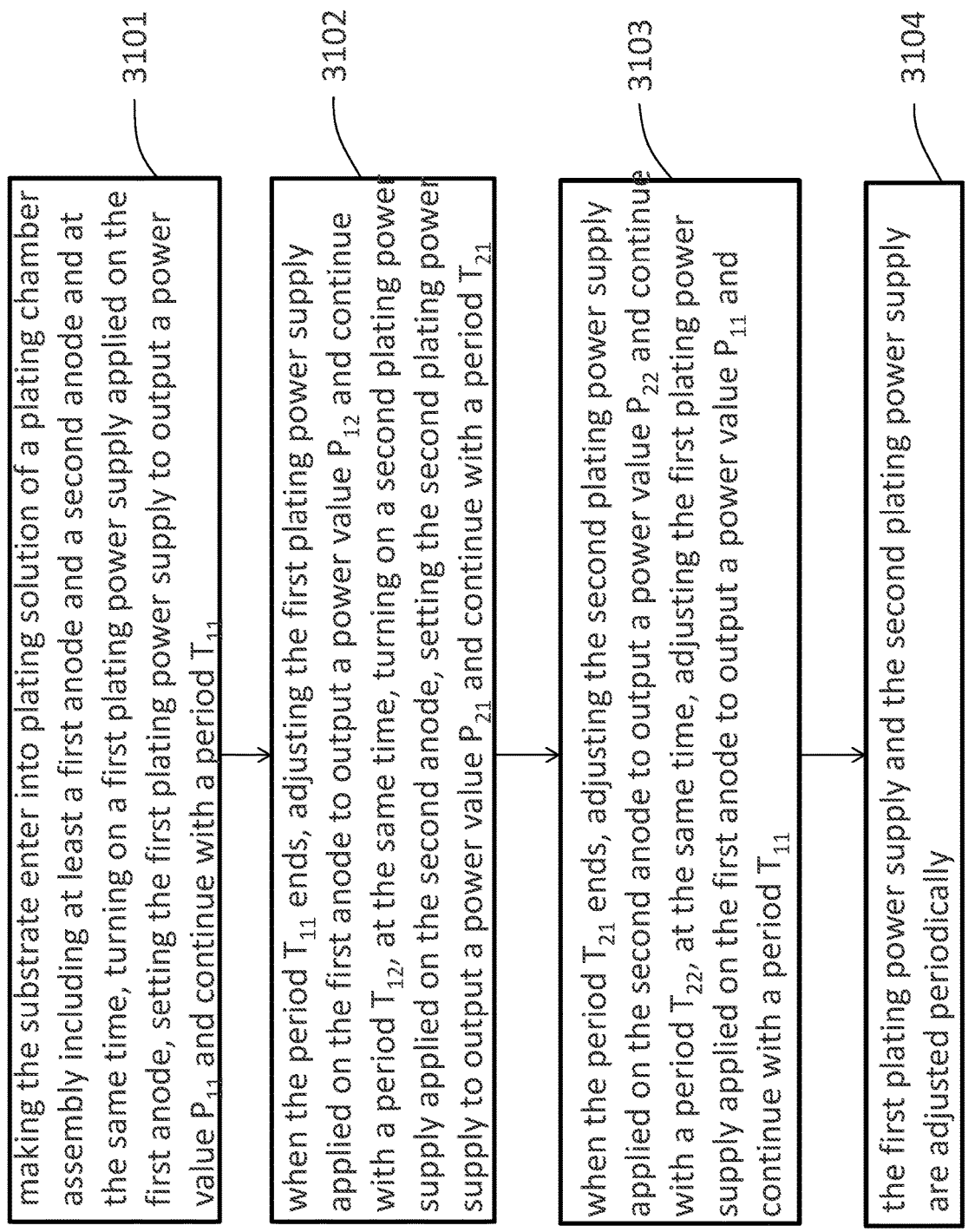
FIG. 31 is a flow chart of a plating method according to another exemplary embodiment of the present invention.

Referring to FIG. 31 and FIG. 32, a plating method according to another embodiment of the present invention is illustrated. The plating method for plating metal layers on a substrate comprising features of patterned structures includes the following steps:

Step 3101: making the substrate enter into plating solution of a plating chamber assembly including at least a first anode and a second anode and at the same time, turning on a first plating power supply applied on the first anode, setting the first plating power supply to output a power value $P_{11}$ and continue with a period $T_{11}$;

Step 3102: when the period $T_{11}$ ends, adjusting the first plating power supply applied on the first anode to output a power value $P_{12}$ and continue with a period $T_{12}$, at the same time, turning on a second plating power supply applied on the second anode, setting the second plating power supply to output a power value $P_{21}$ and continue with a period $T_{21}$;

Step 3103: when the period $T_{21}$ ends, adjusting the second plating power supply applied on the second anode to output a power value $P_{22}$ and continue with a period $T_{22}$, at the same time, adjusting the first plating power supply applied on the first anode to output a power value $P_{11}$ and continue with a period $T_{11}$;

Step 3104: the first plating power supply and the second plating power supply are adjusted periodically. That the first plating power supply is controlled to continuously output a power value $P_{11}$ with a period $T_{11}$ and a power value $P_{12}$ with a period $T_{12}$ can be defined one cycle.

In an embodiment, the power value $P_{12}$ is less than the power value $P_{11}$, the power value $P_{22}$ is less than the power value $P_{21}$.

In an embodiment, there is a time interval between adjusting the first plating power supply to output a power value $P_{12}$ and setting the second plating power supply to output a power value $P_{21}$.

In an embodiment, there is a time interval between adjusting the second plating power supply to output a power value $P_{22}$ and setting the first plating power supply to output a power value $P_{11}$.

In an embodiment, when adjusting the first plating power supply and the second plating power supply, different modes are applied, the different modes have different combinations of power types, power values and length of periods, the modes are selected according to the phases of the plating process.

In an embodiment, the first plating power supply and the second plating power supply are turned on in sequence, and the period $T_{11}$ and the period $T_{21}$ are adjustable, therefore, the plating film thickness corresponding to anode zones accommodating the first anode and the second anode is controlled.

The power value $P_{12}$ and the power value $P_{22}$ are zero or respectively a set value.

The period $T_{11}$ and the period $T_{21}$ are respectively in the range of 0.01 ms to 2000 ms.

The period $T_{12}$ and the period $T_{22}$ are respectively in the range of 0.01 ms to 2000 ms.

In an embodiment, the first plating power supply and the second plating power supply are a pulse direct current.

In an embodiment, the first plating power supply and the second plating power supply are a pulse direct voltage.

In an embodiment, during the period $T_{11}$ and the period $T_{21}$, the first plating power supply and the second plating power supply are a pulse direct current, and during the period $T_{12}$ and the period $T_{22}$, the first plating power supply and the second plating power supply are a pulse direct voltage with a set value.

A plating procedure according to an exemplary embodiment of the present invention will be illustrated. In this exemplary embodiment, the anode chamber of the plating chamber assembly has four anode zones and four anodes. The four anodes can be respectively numbered a first anode, a second anode, a third anode and a fourth anode from the center to edge of the anode chamber. Correspondingly, four plating power supplies are respectively applied on the four anodes. The four plating power supplies can be respectively numbered a first plating power supply applied on the first anode, a second plating power supply applied on the second anode, a third plating power supply applied on the third anode and a fourth plating power supply applied on the fourth anode.

Plating Procedure

Step 3201: a substrate entering plating solution of the plating chamber assembly. In this entry step, traditional methods can be used.

Step 3202: plating of patterned structures of the substrate, which further comprises:

step 32021, turning on the first plating power supply applied on the first anode and setting the first plating power supply to output a power value $P_{11}$ and continue with a period $T_{11}$;

step 32022, when the period $T_{11}$ ends, adjusting the first plating power supply applied on the first anode to output a power value $P_{12}$ and continue with a period $T_{12}$, at the same time, turning on the second plating power supply applied on the second anode, and setting the second plating power supply to output a power value $P_{21}$ and continue with a period $T_{21}$;

step 32023, when the period $T_{21}$ ends, adjusting the second plating power supply applied on the second anode to output a power value $P_{22}$ and continue with a period $T_{22}$, at the same time, turning on the third plating power supply applied on the third anode, and setting the third plating power supply to output a power value $P_{31}$ and continue with a period $T_{31}$;

step 32024, when the period $T_{31}$ ends, adjusting the third plating power supply applied on the third anode to output a power value $P_{32}$ and continue with a period $T_{32}$, at the same time, turning on the fourth plating power supply applied on the fourth anode, and setting the fourth plating power supply to output a power value $P_{41}$ and continue with a period $T_{41}$; and step 32025, when the period $T_{41}$ ends, adjusting the fourth plating power supply applied on the fourth anode to output a power value $P_{42}$ and continue with a period $T_{42}$, at the same time, adjusting the first plating power supply applied on the first anode to output a power value $P_{11}$ and continue with a period $T_{11}$;

wherein step 32022 to step 32025 are performed periodically.

According to another embodiment of the present invention, the step 3202 further comprises:

step 32021, turning on the fourth plating power supply applied on the fourth anode, setting the fourth plating power supply to output a power value $P_{41}$ and continue with a period $T_{41}$;

step 32022, when the period $T_{41}$ ends, adjusting the fourth plating power supply applied on the fourth anode to output a power value $P_{42}$ and continue with a period $T_{42}$, at the same time, turning on the third plating power supply applied on the third anode, and setting the third plating power supply to output a power value $P_{31}$ and continue with a period $T_{31}$;

step 32023, when the period $T_{31}$ ends, adjusting the third plating power supply applied on the third anode to output a power value $P_{32}$ and continue with a period $T_{32}$, at the same time, turning on the second plating power supply applied on the second anode, and setting the second plating power supply to output a power value $P_{21}$ and continue with a period $T_{21}$;

step 32024, when the period $T_{21}$ ends, adjusting the second plating power supply applied on the second anode to output a power value $P_{22}$ and continue with a period $T_{22}$, at the same time, turning on the first plating power supply applied on the first anode, and setting the first plating power supply to output a power value $P_{11}$ and continue with a period $T_{11}$; and step 32025, when the period $T_{11}$ ends, adjusting the first plating power supply applied on the first anode to output a power value $P_{12}$ and continue with a period $T_{12}$, at the same time, adjusting the fourth plating power supply to output a power value $P_{41}$ and continue with a period $T_{41}$;

wherein step 32022 to step 32025 are performed periodically.

When step 32021 to step 32025 are performed, different modes are applied, the different modes have different combinations of power types, power values and length of periods, the modes are selected according to the phases of the plating process.

The four plating power supplies applied on the four anodes are turned on in sequence.

The power value $P_{12}$, the power value $P_{22}$, the power value $P_{32}$, and the power value $P_{42}$ are zero or respectively a set value. The power value $P_{12}$ is less than the power value $P_{11}$. The power value $P_{22}$ is less than the power value $P_{21}$. The power value $P_{32}$ is less than the power value $P_{31}$. The power value $P_{42}$ is less than the power value $P_{41}$.

The period $T_{11}$, the period $T_{21}$, the period $T_{31}$ and the period $T_{41}$ are respectively in the range of 0.01 ms to 2000 ms.

The period $T_{12}$, the period $T_{22}$, the period $T_{32}$ and the period $T_{42}$ are respectively in the range of 0.01 ms to 2000 ms.

Figure 33:
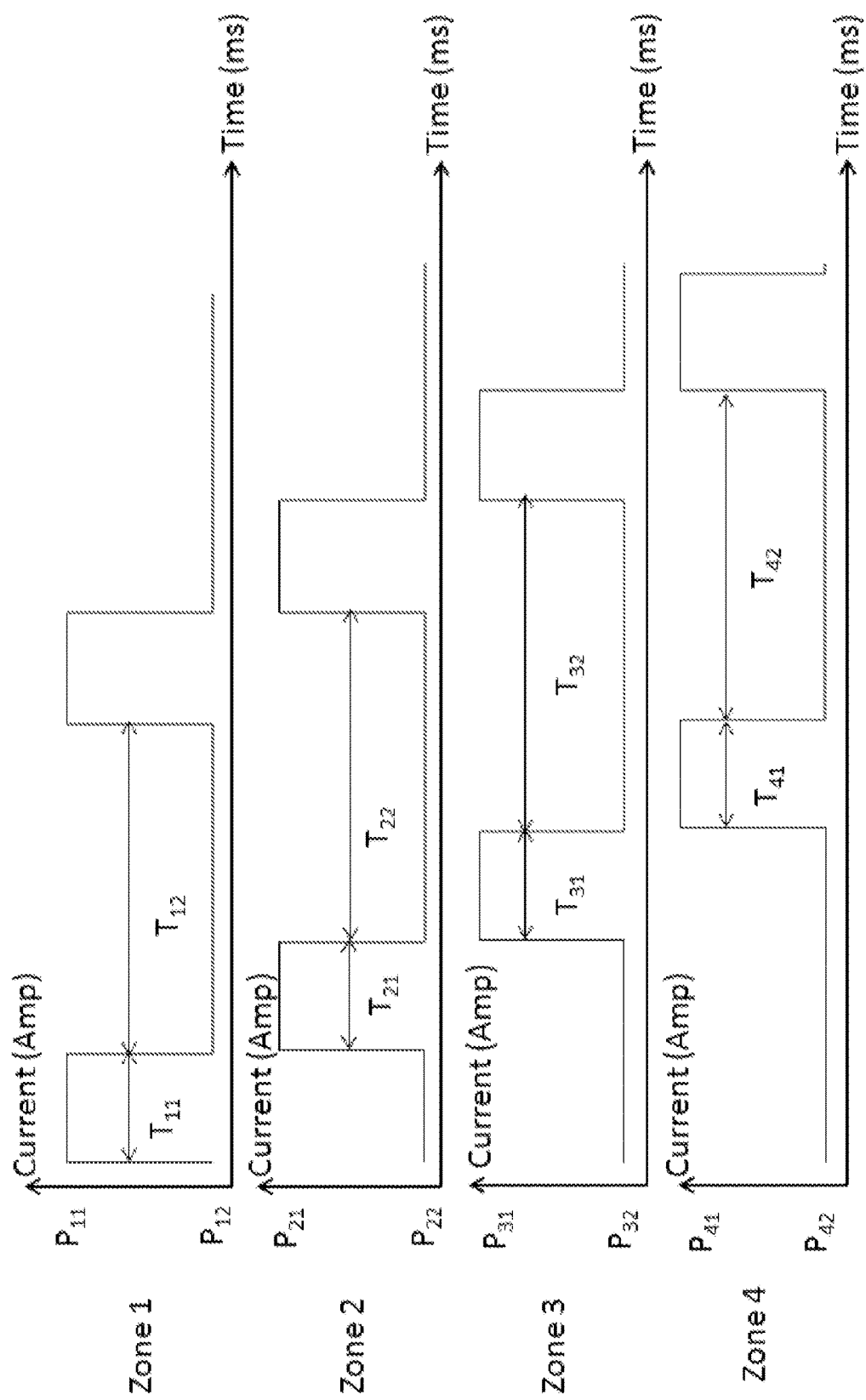
FIG. 33 is a waveform diagram for partial plating according to the present invention.

In an embodiment, the four plating power supplies are a pulse direct current, as shown in FIG. 33.

Figure 34:
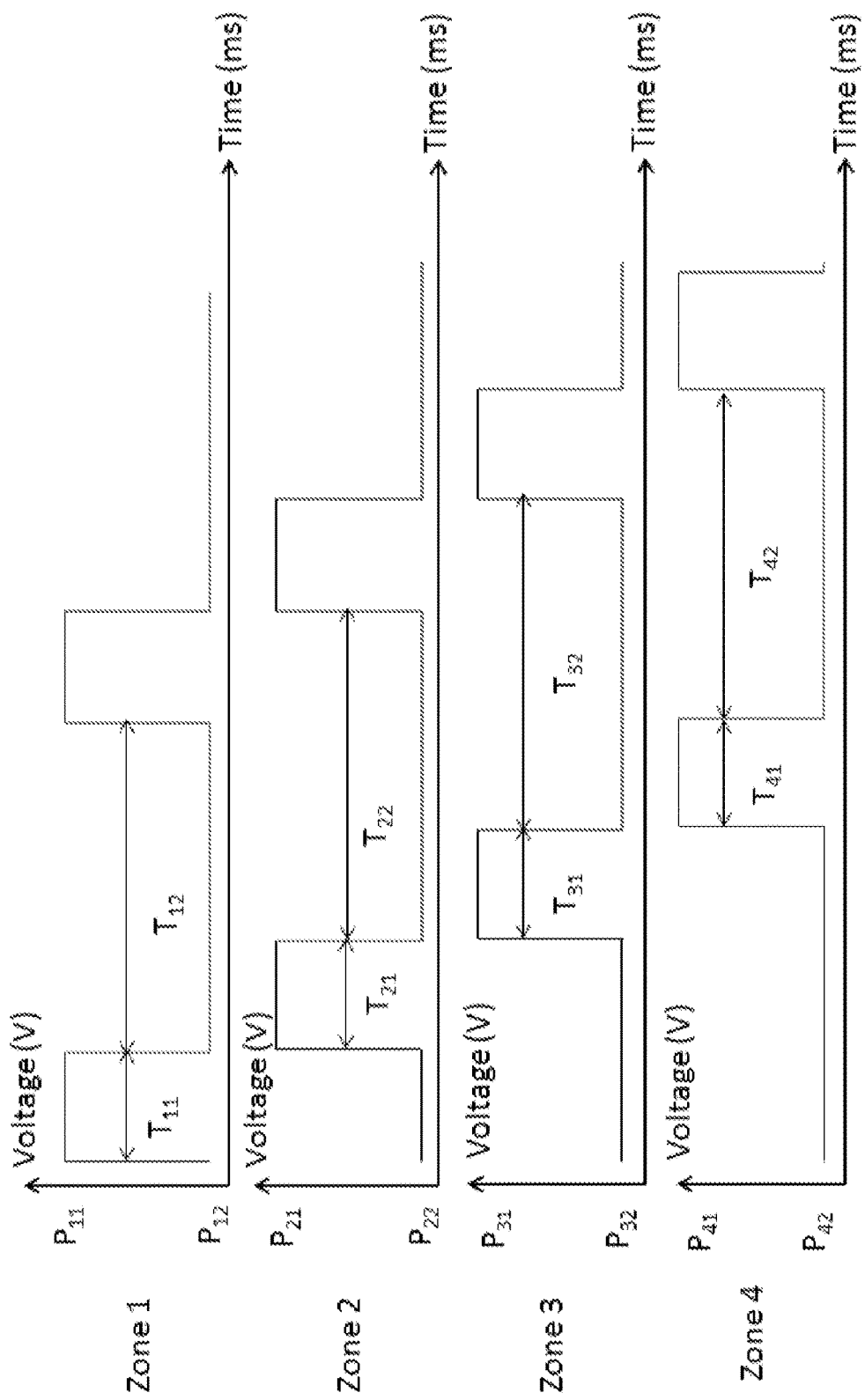
FIG. 34 is another waveform diagram for partial plating according to the present invention.

In another embodiment, the four plating power supplies are a pulse direct voltage, as shown in FIG. 34.

Figure 35:
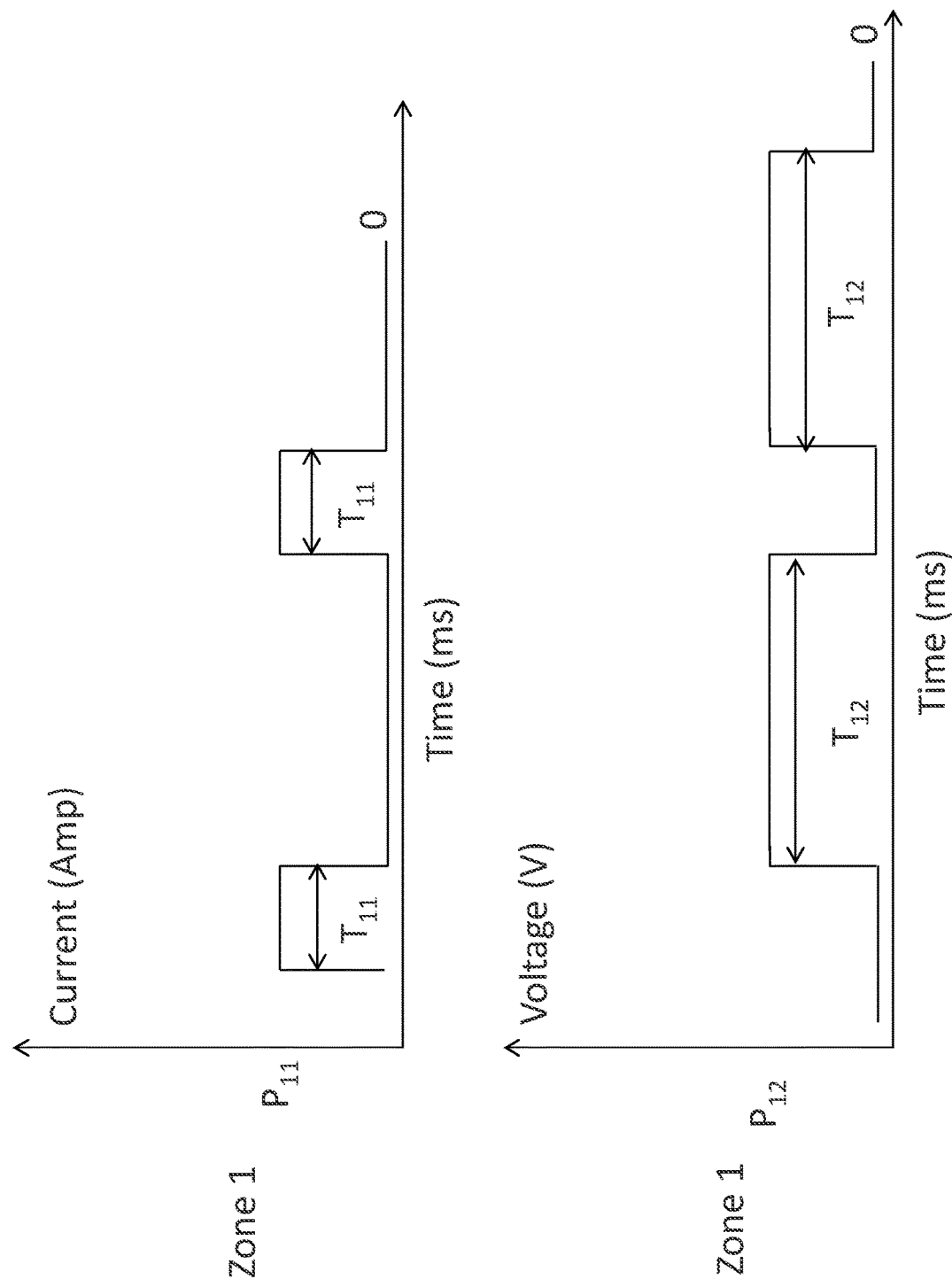
FIG. 35 is yet another waveform diagram for partial plating according to the present invention.

In another embodiment, as shown in FIG. 35, during the period $T_{11}$, the period $T_{21}$, the period $T_{31}$ and the period $T_{41}$, the four plating power supplies are a pulse direct current, and during the period $T_{12}$, the period $T_{22}$, the period $T_{32}$ and the period $T_{42}$, the four plating power supplies are a pulse direct voltage with a set value.

Step 3203: plating overburden metal layer on the substrate. In this step, a direct current or direct voltage is applied to complete the overburden metal layer plating.

Step 3204: carrying out a first drying to the substrate.
Step 3205: carrying out a pre-cleaning to the substrate.
Step 3206: carrying out a second drying to the substrate.

Plating Procedure

Step 3501: making a substrate enter plating solution of the plating chamber assembly and at the same time, turning on the first plating power supply applied on the first anode, setting the first plating power supply to output a power value $P_{11}$ and continue with a period $T_{11}$;

Step 3502: when the period $T_{11}$ ends, adjusting the first plating power supply applied on the first anode to output a power value $P_{12}$ and continue with a period $T_{12}$, at the same time, turning on the second plating power supply applied on the second anode, and setting the second plating power supply to output a power value $P_{21}$ and continue with a period $T_{21}$;

Step 3503: when the period $T_{21}$ ends, adjusting the second plating power supply applied on the second anode to output a power value $P_{22}$ and continue with a period $T_{22}$, at the same time, turning on the third plating power supply applied on the third anode, and setting the third plating power supply to output a power value $P_{31}$ and continue with a period $T_{31}$;

Step 3504: when the period $T_{31}$ ends, adjusting the third plating power supply applied on the third anode to output a power value $P_{32}$ and continue with a period $T_{32}$, at the same time, turning on the fourth plating power supply applied on the fourth anode, and setting the fourth plating power supply to output a power value $P_{41}$ and continue with a period $T_{41}$;

Step 3505: when the period $T_{41}$ ends, adjusting the fourth plating power supply applied on the fourth anode to output a power value $P_{42}$ and continue with a period $T_{42}$, and adjusting the first plating power supply applied on the first anode to output a power value $P_{11}$ and continue with a period $T_{11}$;

Step 3506: repeating the step 3502 to the step 3505 to complete the patterned structures plating;

Step 3507: plating overburden metal layer on the substrate;

Step 3508: carrying out a first drying to the substrate;
Step 3509: carrying out a pre-cleaning to the substrate; and
Step 3510: carrying out a second drying to the substrate.

As described above, the present invention adopts pulse modes for plating metal layers on the substrate, which can protect the seed layer on the substrate. Besides, in the plating process, the amount of electricity per unit time is small, avoiding producing gassing at the anodes. Therefore, the quality of the plating is improved.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A plating method for plating metal layers on a substrate, comprising:
   step 1: immersing a substrate into plating solution of a plating chamber assembly including at least a first anode and a second anode;

step 2: turning on a first plating power supply applied on the first anode, setting the first plating power supply to output a power value $P_{11}$ and continue with a period $T_{11}$;

step 3: when the period $T_{11}$ ends, adjusting the first plating power supply applied on the first anode to output a power value $P_{12}$ and continue with a period $T_{12}$, at the same time, turning on a second plating power supply applied on the second anode, and setting the second plating power supply to output a power value $P_{21}$ and continue with a period $T_{21}$; and step 4: when the period $T_{21}$ ends, adjusting the second plating power supply applied on the second anode to output a power value $P_{22}$ and continue with a period $T_{22}$;

wherein step 2 to step 4 are performed periodically, when step 2 to step 4 are performed, different modes are applied, the different modes have different combinations of power types, power values and length of periods, the modes are selected according to phases of the plating process, and wherein during at least one mode, the power value $P_{11}$ or $P_{12}$ of the first plating power supply is below a plating threshold while at least one of voltage and current of the first plating power supply is positive to repair or protect a seed layer for plating.

2. The plating method according to claim 1, wherein the power value $P_{12}$ is less than the power value $P_{11}$, the power value $P_{22}$ is less than the power value $P_{21}$.

3. The plating method according to claim 1, wherein there is a time interval between adjusting the first plating power supply to output a power value $P_{12}$ and setting the second plating power supply to output a power value $P_{21}$.

4. The plating method according to claim 1, wherein there is a time interval between adjusting the second plating power supply to output a power value $P_{22}$ and setting the first plating power supply to output a power value $P_{11}$.

5. The plating method according to claim 1, wherein the first plating power supply and the second plating power supply are turned on in sequence, and the period $T_{11}$ and the period $T_{21}$ are adjustable.

6. The plating method according to claim 1, wherein the power value $P_{12}$ and the power value $P_{22}$ are zero or respectively a set value.

7. The plating method according to claim 1, wherein the period $T_{11}$ and the period $T_{21}$ are respectively in the range of 0.01 ms to 2000 ms.

8. The plating method according to claim 1, wherein the period $T_{12}$ and the period $T_{22}$ are respectively in the range of 0.01 ms to 2000 ms.

9. The plating method according to claim 1, wherein the first plating power supply and the second plating power supply are a pulse direct current or a pulse direct voltage.

10. The plating method according to claim 1, wherein during the period $T_{11}$ and the period $T_{21}$, the first plating power supply and the second plating power supply are a pulse direct current, and during the period $T_{12}$ and the period $T_{22}$, the first plating power supply and the second plating power supply are a pulse direct voltage with a set value.

* * * * *